US00RE45698E

(19) United States
(12) Reissued Patent
Ishida

(10) Patent Number: US RE45,698 E
(45) Date of Reissued Patent: Sep. 29, 2015

(54) SEMICONDUCTOR MEMORY DEVICE

(71) Applicant: Sony Corporation, Tokyo (JP)

(72) Inventor: Minoru Ishida, Kanagawa (JP)

(73) Assignee: Tessera Advanced Technologies, Inc., San Jose, CA (US)

(21) Appl. No.: 14/061,192

(22) Filed: Oct. 23, 2013

Related U.S. Patent Documents

Reissue of:
(64) Patent No.: 6,101,120
Issued: Aug. 8, 2000
Appl. No.: 09/356,364
Filed: Jul. 19, 1999

(30) Foreign Application Priority Data

Jul. 17, 1998 (JP) ..... 10-202340

(51) Int. Cl.

| | |
|---|---|
| ***G11C 11/00*** | (2006.01) |
| ***G11C 7/00*** | (2006.01) |
| ***G11C 11/24*** | (2006.01) |
| *G11C 13/00* | (2006.01) |
| *G11C 11/56* | (2006.01) |

(52) U.S. Cl.
CPC ..... *G11C 11/24* (2013.01); *G11C 11/5664* (2013.01); *G11C 13/0014* (2013.01); *G11C 13/0069* (2013.01)

(58) Field of Classification Search
CPC ..... G11C 11/5664; G11C 13/0014; G11C 13/0069; G11C 2013/0083; G11C 2013/009; G11C 2213/77; G11C 16/0475; G11C 16/049; G11C 16/0466
USPC ..... 365/154–158, 171–174; 257/368, 369, 257/379, 380, 381, 903, 904
See application file for complete search history.

(56) References Cited

U.S. PATENT DOCUMENTS

| | | | | |
|---|---|---|---|---|
| 5,422,840 | A | 6/1995 | Naiki | 365/156 |
| 5,734,187 | A | 3/1998 | Bohr et al. | 257/377 |
| 5,818,080 | A | 10/1998 | Kuriyama | 257/315 |
| 5,977,597 | A | 11/1999 | Honda | 257/369 |
| 6,005,296 | A | 12/1999 | Chan | 257/904 |
| 6,101,120 | A | 8/2000 | Ishida | |
| 6,434,053 | B1 * | 8/2002 | Fujiwara | 365/185.28 |
| 8,116,118 | B2 * | 2/2012 | Thomas et al. | 365/154 |

FOREIGN PATENT DOCUMENTS

| | | | |
|---|---|---|---|
| JP | 10-171186 | 6/1918 | H01L 27/10 |
| JP | 09-045796 | 2/1997 | |

OTHER PUBLICATIONS

A Low Cost, Microprocessor Compatible, 18.4 μm², 6-T Bulk Cell Technology For High Speed SRAMS, VLSI Symposium Report, pp. 65-66, 1993.

A Novel 6.4 μm² Full-CMOS SRAM Cell with Aspect Ratio of 0.63 in a High-Performance 0.25 μm-Generation CMOS Technology, 1988 Symposium on VLSI Technology Digest of Technical Papers, pp. 68-69.

* cited by examiner

*Primary Examiner* — Hien Nguyen
(74) *Attorney, Agent, or Firm* — Fishman Stewart Yamaguchi PLLC

(57) ABSTRACT

A semiconductor memory device which can reduce the size of a memory cell and increase the packing density is disclosed. Each memory cell comprises a p-type active region, an n-type active region, two word lines, a common gate line and a common gate line. Two memory cells are deviated by, for example, an amount of a half bit in the direction which perpendicularly crosses the word line direction. The memory cells are arranged with one of their parts overlapped with one another in the word line direction. Thus, the size of the memory cell can be reduced in the word line direction.

16 Claims, 22 Drawing Sheets

SEMICONDUCTOR MEMORY DEVICE

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

*The present application is a reissue application of application Ser. No. 09/356,364, now U.S. Pat. No. 6,101,120, issued Aug. 8, 2000. The present invention contains subject matter related Japanese Patent Application JP 10-203240 filed in the Japan Patent Office on Jul. 17, 1998.*

BACKGROUND OF THE INVENTION

1. Field of the Invention

The present invention relates to a semiconductor memory device in which a memory cell such as a 6-transistor SRAM (Static Random Access Memory) cell has a CMOS (Complementary Metal Oxide Semiconductor) structure. More particularly, the invention relates to a semiconductor memory device suitable for a split word line type SRAM in which word lines are arranged so as to be isolated from every word transistor.

2. Description of the Related Art

An SRAM cell generally comprises a flip-flop and two transistors (word transistors) which are made conductive or nonconductive in accordance with a voltage applied to a word line to determine whether each of two storage nodes of the flip-flop is connected to a bit line or not. The SRAM cells can be broadly divided into two types depending on a load element of the flip-flop; an MOS transistor load type and a high-resistance load type. The MOS transistor load type has the structure comprising six transistors. According to the type of the load transistor, there are a known p-channel type MOS transistor (hereinbelow, referred to as pMOS) load type and a known TFT (Thin Film Transistor) load type.

[Related Art 1]

FIG. 27 is a plan view showing an example of an arrangement pattern of a pMOS load type SRAM cell 300 of a related art. The diagram illustrates a state after gates of transistors are formed. An upper wiring layer of connecting lines, bit lines, and the like in the cell is omitted here. Instead, in FIG. 27, connecting lines of parts connected by the upper wiring layer are shown on the pattern.

The pMOS load type SRAM cell 300 has two p-type active regions 302a and 302b in which n-channel type MOS transistors (hereinbelow, referred to as nMOS transistors) are formed and two n-type active regions 304a and 304b in which pMOS transistors are formed. Each of the active regions 302a, 302b, 304a, and 304b is surrounded by a device isolation insulating region of, for example, a LOCOS (Local Oxidation of Silicon) or trench structure.

In the SRAM cell 300 of the related art, each of the two p-type active regions 302a and 302b has a shape in a plan view which is bent outward almost at a right angle. A driving transistor Qn1 (or Qn2) and a word transistor Qn3 (or Qn4) are formed on both sides of the bent part. A word line WL serving as a polysilicon gate electrode of each of the word transistors Qn3 and Qn4 almost perpendicularly crosses the two p-type active regions 302a and 302b and penetrates the cell in the lateral direction in FIG. 27. On the other hand, common gate lines 306a and 306b serving as polysilicon gate electrodes of the driving transistors Qn1 and Qn2 are individually provided in every cell. That is, the common gate line 306a perpendicularly crosses the p-type active region 302a in the vertical direction of FIG. 27. In a similar direction, the common gate line 306b perpendicularly crosses the p-type active region 302b.

The common gate lines 306a and 306b also perpendicularly cross the n-type active regions 304a and 304b, respectively. The pMOS transistors (load transistors Qp1 and Qp2) are formed in the n-type active regions 304a and 304b, respectively. A first inverter is formed by the load transistor Qp1 and the driving transistor Qn1. Similarly, a second inverter is formed by the load transistor Qp2 and the driving transistor Qn2. Each of the common gate lines 306a and 306b is branched at some midpoint. As shown by connecting lines in FIG. 27, the input terminal of one of the inverters is connected to the output terminal of the other inverter in the second polysilicon wiring layer. A supply line of a power source voltage $V_{cc}$, supply line, a common potential $V_{ss}$ supply line, and bit lines BL1 and BL2 are connected as shown in the diagram.

[Related Art 2]

In recent years, a split word line type SRAM cell in which word lines are arranged so as to be isolated from every word transistor has been proposed in, for example, "A low Cost Microprocessor Compatible, 18.4 $\mu m^2$, 6-T Bulk Cell Technology for High Speed SRAMs", VLSI Symposium Report, pp 65-66, 1993.

FIG. 28 is a plan view, in a manner similar to FIG. 27, showing an arrangement pattern of a split word line type cell described in the literature.

In a split word line type SRAM cell 310, a p-type active region 312 in which nMOS transistors are formed is provided so as to be commonly used by inverters and word transistors and is also commonly used by cells neighboring in the word line direction. Similarly, an n-type active region 314 in which pMOS transistors are formed is commonly formed in between each inverter and in between each cell neighboring in the word line direction. The connecting lines shown in FIG. 28 are basically similar to those in FIG. 27. A p-MOS transistor and an n-MOS transistor of each inverter are connected in series in the second polysilicon layer. A connecting part of the series connection point of the p-MOS and n-MOS transistors and the input terminal of another inverter, the power source voltage $V_{cc}$ supply line and the like are formed in the third polycide layer. The common potential $V_{ss}$ supply line and the bit lines are formed in the fourth metal wiring layer.

Generally, in order to increase the packing density and the capacity of a semiconductor memory device, it is indispensable to make a finer pattern. The formation of a finer pattern can be achieved by making a pattern itself finer and introduction of a self aligning formation technique which does not require a reduction in a deviation amount in alignment of photo masks in different patterns and improvement on an alignment deviation between patterns.

The former technique of making a pattern itself finer is achieved by improving the material of a resist, increasing a process accuracy of wiring and the like which are formed by using the resist as a pattern transfer mask and shortening the wavelength of light from the light source of an aligner from the g and i lines, a KrF excimer laser, an Ar excimer laser, and further to an X-ray.

On the other hand, with respect to the alignment deviation among patterns in the latter technique, by applying the self aligning formation technique, the alignment deviation can be largely reduced while assuring good characteristics and high reliability. In an actual device manufacture, however, processes to which the self aligning formation technique can be applied are limited. In the other processes, the deviation among patterns depends on the machine accuracy of the aligner. Since the machine accuracy has not been improved largely, under the present circumstances, the reduction in the amount of deviation has not progressed as much as the reduction in size of the pattern.

A pattern design such that even when a deviation occurs in the alignment of patterns during a process to which the self aligning technique cannot be applied, the deviation does not become a problem from the viewpoint of characteristics, reliability, and the like is demanded.

In the SRAM cells of the related arts 1 and 2 shown in FIGS. 27 and 28, however, the deviation among patterns is not sufficiently considered in the pattern design.

For example, in the SRAM cell 300 of the related art 1 shown in FIG. 27, each of the p-type active regions 302a and 302b in which the nMOS transistors are formed bends outward. Although the pattern on the mask is a combination of rectangles, as illustrated in the diagram, an actual finished pattern is deformed with the corners largely rounded. This is caused by excessive light intensity in the case of pattern formation by leaving a resist or by insufficient light intensity in the case of pattern formation by removing a resist when exposure is performed by using a mask pattern (pattern transfer) onto the resist. In the specifically shown example, the gate width (i.e., the size of an overlapped part in the direction which perpendicularly crosses the channel current direction) of each of the driving transistors Qn1 and Qn2 tends to increase and the gate width of each of the word transistors Qn3 and Qn4 tends to decrease.

In addition to the pattern deformation, the patterns themselves of the p-type active regions 302a and 302b are bent and the transistor size (i.e., the size of the channel forming region) varies due to the deviation of the photo mask when gate electrodes (in this case, the word line WL and the common gate lines 306a and 306b) are formed on the patterns. For instance, in FIG. 27, when the gate pattern such as common gate lines 306a and 306b is deviated to the right side with respect to the pattern of the p-type active regions 302a and 302b (LOCOS pattern in practice), the gate width of the driving transistor Qn2 decreases and the gate width of the driving transistor Qn1 increases. On the contrary, when the gate pattern is deviated to the left side, the gate width of the driving transistor Qn1 decreases and the gate width of the driving transistor Qn2 increases. In any case, the characteristics of the two inverters constructing the flip-flop become accordingly unequal. Thus, the stability of the flip-flop and further the data holding characteristics of the SRAM memory cell deteriorate.

When the gate pattern is deviated downward, the gate width of each of the word transistors Qn3 and Qn4 is reduced. At the time of reading or writing data from/to the SRAM memory cell, especially on the low node side maintained at a low potential level, the resistance in a current path of the cell current flowing from the bit line, word transistor, storage node, driving transistor, and to the common potential supplying line becomes high and the reading or writing operation becomes slow. On the contrary, when the gate pattern is deviated upward, although there does not occur any problem in the cell shown in FIG. 27, a similar problem which occurs when the gate pattern is deviated downward occurs in an upper cell which is adjacent to the cell of FIG. 27. The cells are arranged to be symmetrical in the vertical direction with respect to the bit contacts as a center. As a result, the resistance in the cell current path increases and the reading or writing operation becomes slow.

As described above, when the size on the nMOS transistor side changes, that is, when the sizes of the driving transistor and the word transistor change relatively, the cell characteristics (i.e., data holding characteristic, high speed, and the like) deteriorate. The deviation among patterns slightly varies according to a position in a wafer (for example, every chip), the characteristics also change according to the position in the wafer. This appears as a characteristic variation of semiconductor products, occurring in memory cell arrays or chips.

The problem of the deterioration and variation in the characteristics due to the variation in transistor size also occurs in the split word line type SRAM cell illustrated in FIG. 28. In the split word line type SRAM cell 310, the active regions 312 and 314 are commonly connected to neighboring cells and the common connection part is bent with respect to the other part. Consequently, the size change becomes a problem in both of the driving transistors Qn1 and Qn2 and the load transistors Qp1 and Qp2 which are adjacent to the bent part. Especially, the SRAM cell of this type is sensitive to the deviation in the bit line wiring direction and a variation tends to occur among inverters. The data holding characteristic of the memory cell deteriorates in this case as well, and the reading or writing speed becomes lower.

As another related art, "A Novel 6.4 $\mu m^2$ Full-CMOS SRAM Cell with Aspect Ratio of 0.63 in a High-Performance 0.25 μm-Generation CMOS Technology", 1998 Symposium on VLSI Technology Digest of Technical Papers discloses a pattern for a high speed SRAM. Since the SRAM has a region in which an active region is bent, it has also a problem similar to that of the related arts.

The problem of the deterioration and variation in the characteristics can be avoided by sufficiently separating the gate electrode from the bent part in the active region. It is not, however, preferable since the cell area increases.

The applicant of the present invention has consequently proposed a cell pattern and a semiconductor memory device having a cell structure which can effectively prevent the deterioration in the characteristics due to a deviation in patterns at the time of forming the gate while effectively suppressing enlargement of the memory cell area or, moreover, reducing the memory cell area (Japanese Unexamined Patent Application No. 10-171186). The outline of the semiconductor memory device will now be described hereinbelow.

FIGS. 29 to 32 show pattern structures and cross sections in processes of fabricating the SRAM cell 200 as an example of the semiconductor memory device which has been proposed before.

In a state shown in FIG. 29, a device isolation region 202 such as LOCOS or trench is formed on the surface side of a semiconductor substrate 201 such as a silicon wafer in which a p-type well region and an n-type well region (not shown) are formed. The surface region of the p-type well region in which the device isolation region 202 is not formed is a p-type active region 203 in which an n-type MOS channel is formed. The surface region of the n-type well region in which the device isolation region 202 is not formed is an n-type active region 204 in which a pMOS channel is formed. The two active regions 203 and 204 each having a rectangular pattern are formed in parallel. FIG. 30 is a cross section taken along the line M-M' of FIG. 29.

In the process shown in FIG. 32, after performing ion implantation for threshold voltage control or channel stopper as required, a gate oxide film 205, a first polysilicon or polycide layer (hereinbelow, referred to as "1PS"), and an offset insulating film 208 are sequentially formed. The 1PS is comprised of, for example, a polysilicon film 206 and a WSix film 207. The gate oxide film 205 and the offset insulating film 208 are made of oxide silicon. The thickness of each of the polysilicon film 206 and the WSix film 207 is about 70 nm. The thickness of the offset insulating film 208 is about 200 nm. By introducing impurities at the time of or after the film formation, the polysilicon film 206 is made conductive.

Subsequently, the offset insulating film 208, the WSix film 207, the polysilicon film 206, and the gate oxide film 205 are successively processed, thereby simultaneously forming two word lines WL1 and WL2 also serving as gate electrodes of two word transistors, a common gate line GL1 also serving as gate electrodes of the driving and load transistors, and a common gate line GL2 also serving as gate electrodes of the driving and load transistors.

The two word lines WL1 and WL2 perpendicularly cross near both ends of the p-type active region 203, penetrate the cells, and are arranged in parallel to each other. The common gate lines GL1 and GL2 perpendicularly cross both of the p-type active region 203 and the n-type active region 204 within the interval of the word lines WL1 and WL2 and are arranged in parallel to each other so that the common gate lines GL1 and GL2 and the word lines WL1 and WL2 are spaced at regular intervals. Each of the common gate lines GL1 and GL2 has a rectangular pattern provided for every cell and is isolated from common gate lines (not illustrated) of cells neighboring in the word line direction. FIG. 32 is a cross section taken along the line N-N' of FIG. 31.

In the SRAM cell having such a structure, each of the two active regions 203 and 204 in the cell is formed in a simple rectangular pattern or a pattern of an almost rectangular shape with a step so that the channel current directions are in parallel. Gate electrode patterns (word lines WL1 and WL2 and the common gate lines GL1 and GL2) formed on the active regions 203 and 204 are arranged in parallel to each other. Due to a deviation in alignment at the time of formation of the gate electrode patterns, therefore, the size of the transistor (i.e., the size of the area in which the gate electrode pattern and the active area is overlapped) uniformly changes in transistors. As for the alignment, there is the possibility that not only a pattern deviation in the xy directions but also a rotation deviation (deviation 0) occurs. Due to any of the xy direction deviation and the deviation 0, the sizes of all transistors uniformly change. Especially, since the pattern does not have the bent active region unlike the conventional pattern, it is not easily influenced by a distortion in the pattern shape caused by excessive or insufficient exposure intensity. That is, as long as there is not a large alignment deviation to the ends of the active areas 203 and 204 as rectangular patterns, the situation such that the size of only a specific transistor changes as in the related arts can be effectively avoided.

Since the transistor characteristics in the cells do not vary due to the alignment deviation in the patterns, the inverter characteristics of the memory cell are therefore stabilized. Various effects such that the charge holding characteristics of the SRAM cell do not deteriorate during a manufacturing process and excellent cell characteristics are obtained can be produced.

Although the excellent effects as described above can be obtained, since memory cells are arranged bit by bit in the vertical direction (that is, the word and bit line directions) in a matrix state, the SRAM cell has a problem such that it is difficult to further increase the packing density.

SUMMARY OF THE INVENTION

The invention has been achieved in consideration of the problem and it is an object of the invention to provide a semiconductor memory device which can reduce the size of a memory cell and can further increase the packing density.

A semiconductor memory device of the invention has a plurality of memory cells each comprising a first transistor of a first conductive type and a second transistor of a second conductive type, wherein a first active region in which a channel of the first transistor is formed and a second active region in which a channel of the second transistor is formed are arranged so that the channel current direction of the first transistor and the channel current direction of the second transistor are in parallel to each other in each memory cell, and two memory cells among the plurality of memory cells, which are adjacent to each other in a direction which perpendicularly crosses the channel current direction have a positional relation such that the two memory cells are deviated from each other by, for example, a half bit in the channel current direction.

A semiconductor memory device according to the invention has a plurality of memory cells each comprising a first transistor of a first conductive type and a second transistor of a second conductive type, wherein a first active region in which a channel of the first transistor is formed and a second active region in which a channel of the second transistor is formed are arranged so that the channel current direction of the first transistor and the channel current direction of the second transistor are in parallel to each other in each memory cell, and two memory cells, among the plurality of memory cells, which are adjacent to each other in a direction which perpendicularly crosses the channel current direction have a positional relation such that the two memory cells are deviated from each other in the channel current direction and a part of one of the two memory cells is overlapped with a part of the other memory cell.

In the semiconductor memory device according to the invention, since two memory cells which are adjacent in a direction which perpendicularly crosses the channel current direction have a positional relation such that the two memory cells are deviated from each other in the channel current direction, the two adjacent memory cells can be arranged so that a part of one of the two memory cells is overlapped with a part of the other memory cell. Thus, the size of the memory cell is reduced and the packing density is increased.

In another semiconductor memory device according to the invention, since two memory cells which are adjacent to each other in a direction which perpendicularly crosses the channel current direction have a positional relation such that the two memory cells are deviated from each other in the channel current direction and are arranged so that a part of one of the two memory cells is overlapped with a part of the other memory cell in the direction which perpendicularly crosses the channel current direction. Thus, the size of the memory cell is reduced and the packing density can be increased.

Other and further objects, features and advantages of the invention will appear more fully from the following description.

DETAILED DESCRIPTION OF THE PREFERRED EMBODIMENTS

Embodiments of the invention will be described in detail hereinbelow with reference to the drawings.

Figure 1:
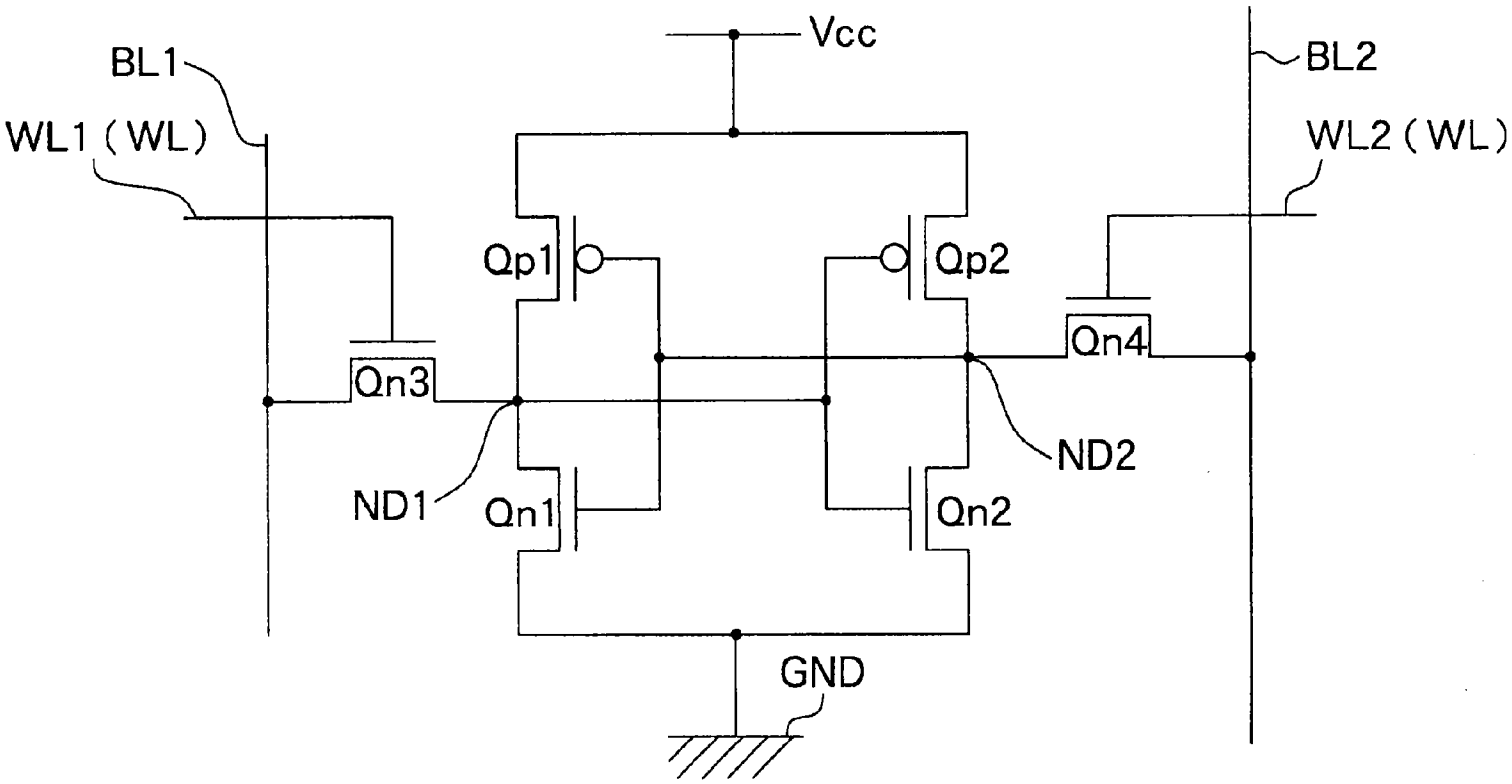
FIG. 1 is a circuit configuration diagram of a pMOS load type SRAM cell according to an embodiment of the invention.

FIG. 1 shows a circuit configuration of a 6-transistor pMOS load type SRAM cell according to an embodiment of the invention.

The pMOS load type SRAM cell has n-channel type MOS transistors (hereinbelow, referred to as nMOS transistors) Qn1 and Qn2 and p-channel type MOS transistors (hereinbelow, referred to as pMOS transistors) Qp1 and Qp2. The nMOS transistors Qn1 and Qn2 act as driving transistors and the pMOS transistors Qp1 and Qp2 act as load transistors. The pMOS transistors Qp1 and Qp2 and the nMOS transistors Qn1 and Qn2 construct two inverters (flip-flop) in which the input terminals cross each other, one of the input terminals is connected to the output terminal of the other inverter, and the input terminal of the other inverter is connected to the output terminal of the one of the inverters.

nMOS transistors Qn3 and Qn4 denote word transistors for controlling whether the connection points (storage nodes ND1 and ND2) of the inverters are connected to bit lines BL1 and BL2 or not in accordance with voltages applied to word lines WL1 and WL2. This cell structure is common so that further detailed description of the connection is omitted here.

In the pMOS load type SRAM cell, by applying a predetermined voltage to the gates of the word transistors Qn3 and Qn4 via the word lines WL1 and WL2 so as to make the potential of one (BL1) of the bit lines high, both of the transistors Qn3 and Qn4 are turned on and charges are accumulated in the storage nodes ND1 and ND2. As a feature of the flip-flop structure, the driving transistors Qn1 and Qn2 and the load transistors Qp1 and Qp2 operate in such a manner that, when one of the storage nodes goes high (H), the other storage node goes low (L). For example, when the storage node ND1 is "H" and the storage node ND2 is "L", the transistors Qn2 and Qp1 enter the ON state and the transistors Qn1 and Qp2 enter the OFF state. Charges are supplied from the power source voltage $V_{cc}$ supply line to the storage node ND1 and the storage node ND2 is held at the ground potential. In the case where the storage node ND1 is forcedly shifted to "L" by turning on the word transistor Qn3 when the potential of the bit line BL1 is "L", or in the case where the storage node ND2 is forcedly shifted to "H" by turning on the word transistor Qn4 when the potential of the bit line BL2 is "H", all of the transistors Qn1, Qn2, Qp1, and Qp2 are inverted, the charges from the power source voltage $V_{cc}$ supply line are supplied to the storage node ND2, and the storage node ND1 is held at the ground potential. As described above, by holding the charges by the flip-flop, the charges are statically held at the storage nodes ND1 and ND2, the potential "L" or "H" is associated with data of "0" or "1", and the data can be stored by the six transistors in the cell.

The structure of the fundamental pattern of the 6-transistor type SRAM cell according to the embodiment of the invention will now be described with reference to FIGS. 2 to 5 The SRAM is of the split word line type. Each memory cell 10 comprises a p-type active region 13, an n-type active region 14, two word lines 21a and 21b (WL1 and WL2) also serving as gate electrodes of the word transistors Qn3 and Qn4, a common gate line 22a (GL1) also serving as gate electrodes of the driving transistor Qn1 and the load transistor Qp1, and a common gate line 22b (GL2) also serving as gate electrodes of the driving transistor Qn2 and the load transistor Qp2.

The two word lines 21a and 21b perpendicularly cross near both ends of the p-type active region 13 and are arranged in parallel to each other. The common gate lines 22a and 22b are positioned between the word lines 21a and 21b and perpendicularly cross the p-type active region 13 and the n-type active region 14. The common gate lines 22a and 22b are arranged in parallel to each other so that the word lines 21a and 21b and the common gate lines 22a and 22b are arranged in parallel to each other at regular intervals. The common gate lines 22a and 22b are rectangular patterns provided for each cell and are isolated from common gate lines of cells which are neighboring in the word line direction.

In the embodiment, two neighboring memory cells 10 and 10' with their n-type active regions 14 facing each other are arranged so as to be deviated from each other by an amount of, for example, a half bit in the direction (i.e., the channel current direction) which perpendicularly crosses the word line direction from the positions where the memory cells 10 and 10' perfectly face each other. The memory cells 10 and 10' are disposed so that parts of the memory cells 10 and 10' are overlapped with each other in the word line direction. That is, in the embodiment, by making the neighboring two memory cells 10 and 10' deviated from each other by an amount of a half bit in the direction which perpendicularly crosses the word line direction, the long common gate lines 22a and 22b which conventionally have faced those in the neighboring cells are deviated. By using the deviation, the memory cells 10 and 10' are deviated also in the word line direction with their parts overlapped with each other. In the embodiment, consequently, the size of the memory cell can be reduced in the word line direction. Although the memory cells 10 and 10' have the positional relation such that the common gate lines 22a and 22b face the word lines 21a and 21b, respectively, in the embodiment, since the word lines 21a and 21b are short as described above, the common gate line and the word line are not in contact.

The process of manufacturing the SRAM will be described with reference to FIGS. 2 to 25. The even-numbered diagrams (FIGS. 2, 4, . . . , 22, and 24) illustrate pattern overlapped states in respective processes. The odd-numbered diagrams (FIGS. 3, 5, . . . , and 25) show corresponding structures in cross section in the respective processes.

Figure 2:
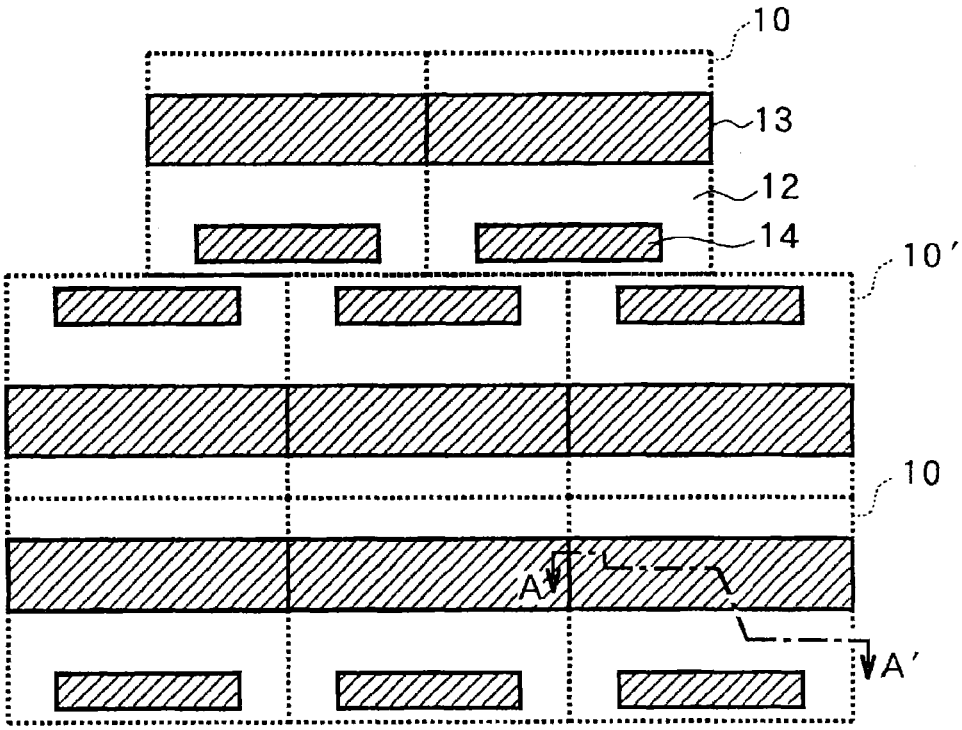
FIG. 2 is a pattern arrangement diagram for explaining a process of manufacturing an SRAM according to the embodiment of the invention.
Figure 3:
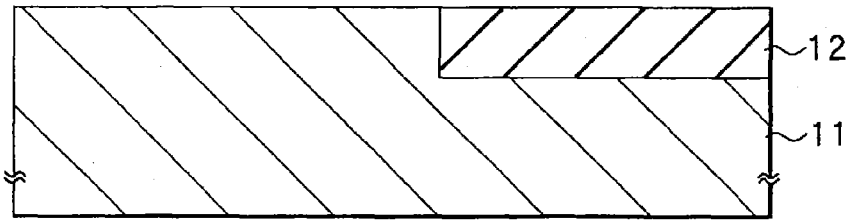
FIG. 3 is a cross section taken along the line A-A' of FIG. 2.

According to the embodiment, as illustrated in FIGS. 2 and 3, in each memory cell 10, a device isolation region 12 such as LOCOS or trench is formed on the surface of a semiconductor substrate 11 such as a silicon wafer in which p-well regions and n-well regions (not shown) are formed. The surface region of the p-well region in which the device isolation region 12 is not formed serves as the p-type active region 13 in which an n-type MOS channel is formed, and the surface region of the n-type well region in which the device isolation region 12 is not formed serves as the n-type active region 14 in which the pMOS channel is formed. The two active regions 13 and 14 each having a rectangular pattern are formed in parallel to each other. In the embodiment, as described above, the neighboring memory cells 10 and 10' with their n-type active regions 14 facing each other are deviated from each other by, for example, a half bit in the direction (i.e., the channel current direction) which perpendicularly crosses the word line direction from the positions where the memory cells 10 and 10' perfectly face each other. The memory cells 10 and 10' are arranged so that their parts are overlapped with each other in the word line direction. FIG. 3 is a cross section taken along the line A-A' of FIG. 2.

Figure 4:
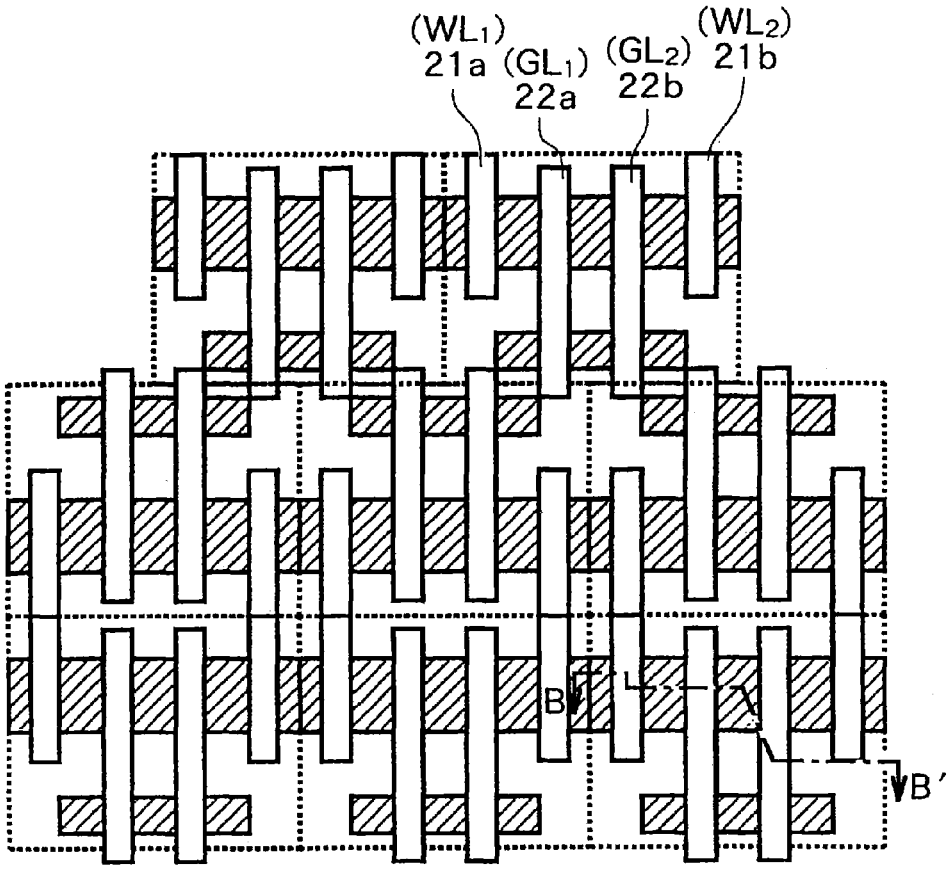
FIG. 4 is a pattern arrangement diagram for explaining the process of manufacturing the SRAM, which is continued from FIG. 2.
Figure 5:
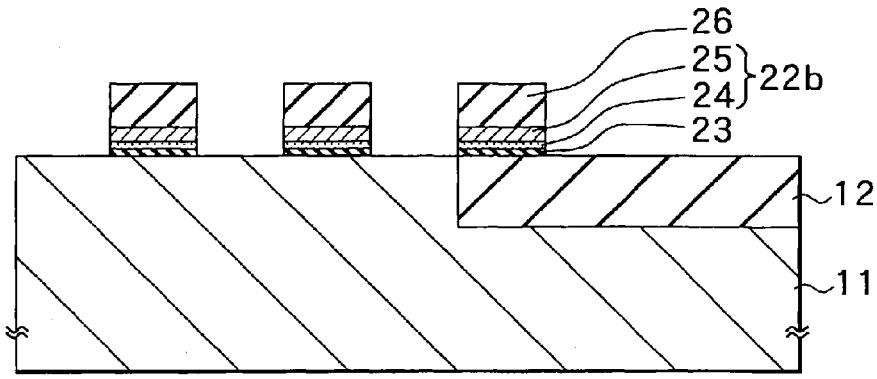
FIG. 5 is a cross section taken along the line B-B' of FIG. 4.

As shown in FIGS. 4 and 5, after performing ion implantation for threshold voltage control or channel stopper as required, a gate oxide film 23, a first polysilicon or polycide layer (hereinbelow, referred to as "1PS"), and an offset insulating film 26 are sequentially formed. The 1PS is comprised of, for example, a polysilicon film 24 and a WSix (tungsten silicide) film 25. The gate oxide film 23 and the offset insulating film 26 are made of silicon oxide. The thickness of each of the polysilicon film 24 and the WSix film 25 is about 70 nm. The thickness of the offset insulating film 26 is about 200 nm. By introducing impurities at the time of or after the film formation, the polysilicon film 24 is made conductive.

Subsequently, the offset insulating film 26, the WSix film 25, the polysilicon film 24, and the gate oxide film 23 are successively processed by using the gate electrode pattern, thereby simultaneously forming the two word lines 21a and 21b (WL1 and WL2) also serving as the gate electrodes of the word transistors Qn3 and Qn4, the common gate line 22a (GL1) also serving as the gate electrodes of the driving transistor Qn1 and the load transistor Qp1, and the common gate line 22b (GL2) also serving as the gate electrodes of the driving transistor Qn2 and the load transistor Qp2.

The two word lines 21a and 21b perpendicularly cross parts near both ends of the p-type active region 13, and are arranged in parallel to each other. The length of each of the word lines is as short as about a half bit. The common gate lines 22a and 22b perpendicularly cross both of the p-type active region 13 and the n-type active region 14, between the word lines 21a and 21b and are arranged in parallel to each other so that the common gate lines 22a and 22b and the word lines 21a and 21b are spaced at regular intervals. Each of the word lines 21a and 21b and the common gate lines 22a and 22b is patterned in a rectangular shape. FIG. 5 is a cross section taken along the line B-B' of FIG. 4.

Figure 6:
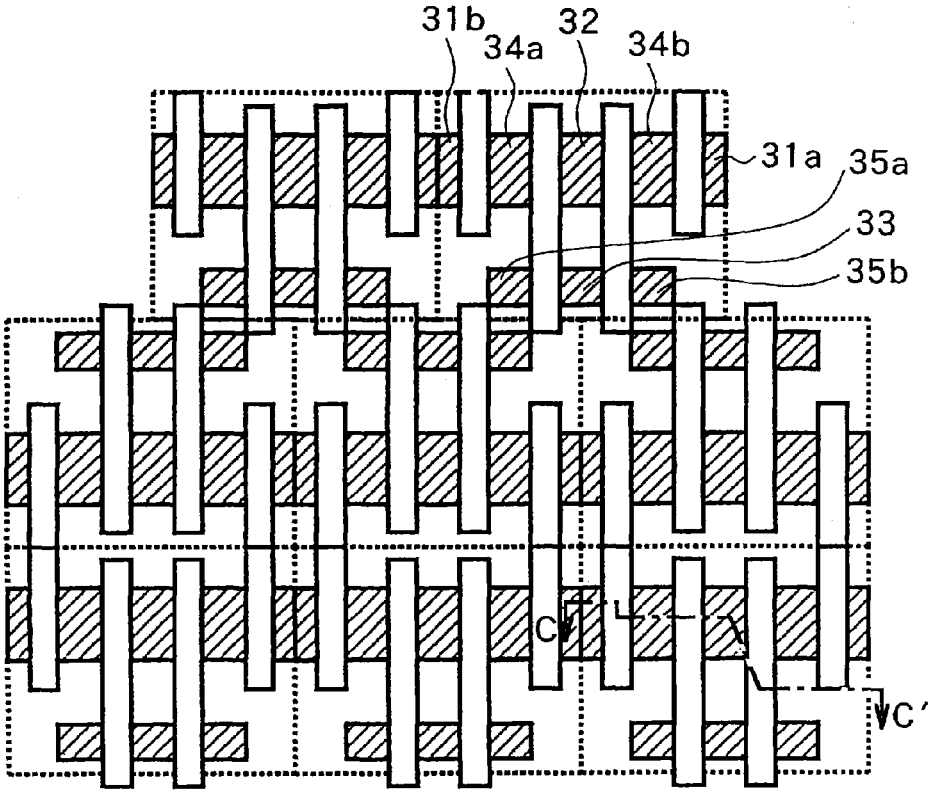
FIG. 6 is a pattern arrangement diagram for explaining the process of manufacturing the SRAM, which is continued from FIG. 4.
Figure 7:
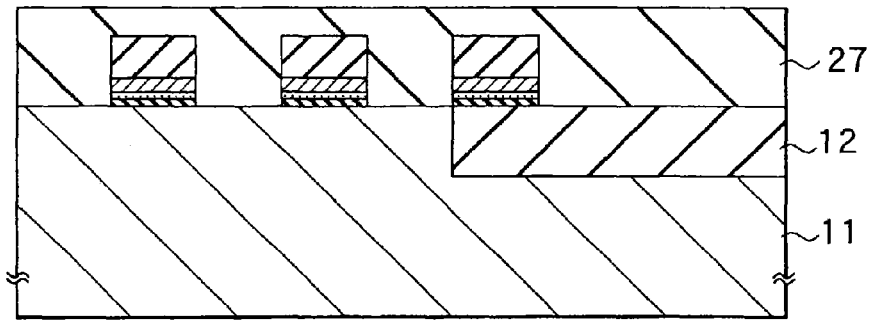
FIG. 7 is a cross section taken along the line C-C' of FIG. 6.

As shown in FIGS. 6 and 7, impurity regions serving as a source and a drain of each transistor are formed by a known transistor forming process. By the process, diffusion layer regions 31a and 31b to which bit lines are connected, a diffusion layer region 32 to which the ground line is connected, a diffusion layer region 33 to which the power source line Vcc is connected, diffusion layer regions 34a and 34b serving as n-type storage nodes, and diffusion layer regions 35a and 35b serving as p-type storage nodes are formed. Consequently, the word transistor Qn3, the driving transistor Qn1, the driving transistor Qn2, and the word transistor Qn4 are simultaneously formed in a state where they are connected in series in the p-type active region 13, and the load transistors Qp1 and Qp2 are simultaneously formed in a state where they are connected in series in the n-type active region 14. Then, a first interlayer insulating film 27 is formed on the whole surface and the surface is flattened as necessary.

In the embodiment, to achieve self aligned contact which will be described hereinlater, the first interlayer insulating film 27 is formed by two kinds of films each having a high selective ratio. For example, the film 27 is formed by a layered film comprised of a silicon nitride film as a lower layer and a silicon oxide film as an upper layer. FIG. 7 is a cross section taken along the line C-C' of FIG. 6.

Figure 8:
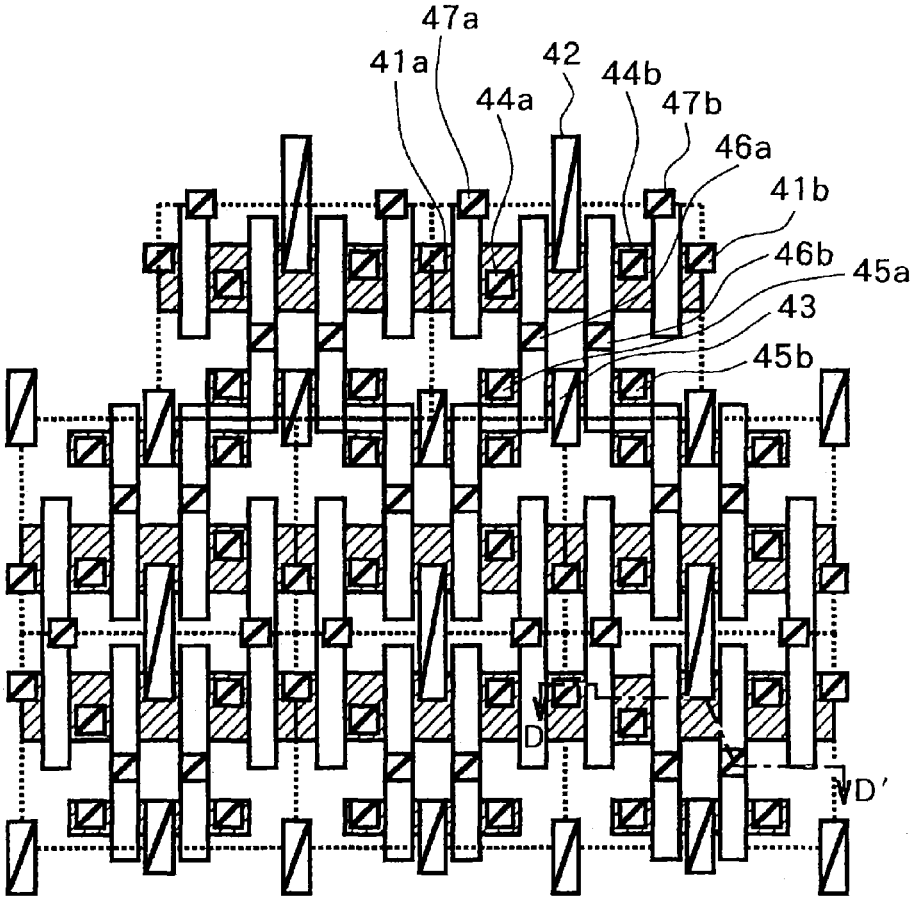
FIG. 8 is a pattern arrangement diagram for explaining the process of manufacturing the SRAM, which is continued from FIG. 6.
Figure 9:
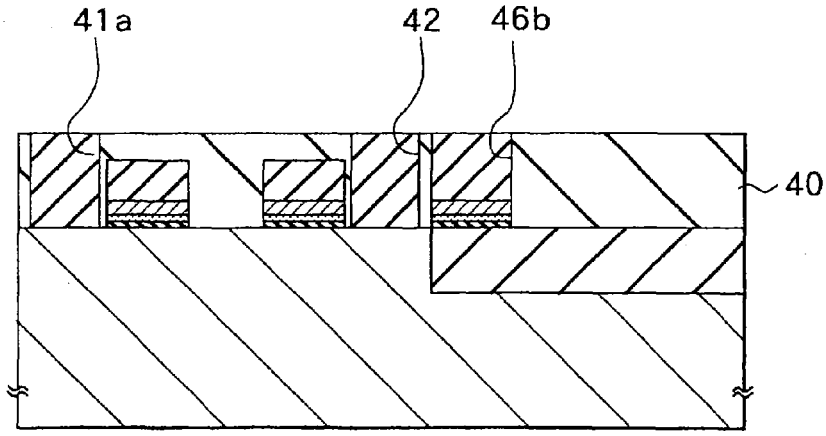
FIG. 9 is a cross section taken along the line D-D' of FIG. 8.

As shown in FIGS. 8 and 9, in the diffusion layer regions 31a and 31b to which the bit lines are connected, bit line contacts 41a and 41b are formed so as to be commonly used by neighboring memory cells. Further, in the diffusion layer region 32 to which the ground line is connected, a ground line contact 42 is formed. In the diffusion layer region 33 to which the power source line is connected, a power source line contact 43 is formed. In the diffusion layer regions 34a and 34b serving as n-type storage nodes, n-type storage node contacts 44a and 44b are formed. In the diffusion layer regions 35a and 35b serving as p-type storage nodes, p-type storage node contacts 45a and 45b are formed. FIG. 9 is a cross section taken along the line D-D' of FIG. 8.

The contacts 41a, 41b, . . . , 45a, and 45b are formed by the conventional aligned contact or self aligned contact method. In any of the contact forming processes, after a resist pattern is formed by photo lithography, the insulating film is subjected to anisotropic etching by using the resist pattern as a mask.

Further, gate electrode contacts 46a and 46b for connection to the n-type storage nodes 34a and 34b and the p-type storage nodes 35a and 35b are formed on the common gate lines 22a and 22b. Word line contacts 47a and 47b for connection to the word lines 21a and 21b of the upper layer are formed on the gate electrodes 21a and 21b of the word transistors. Each of the contacts 46a, 46b, 47a, and 47b is formed so that the whole bottom face or a part of the bottom face of the contact is in contact with the top face of each of the common gate lines 22a and 22b and the word lines 21a and 21b. In the latter case, since a part of the bottom face of the contact is opened toward the device isolation region, an insulating film of the opening of the contact is etched so that the bottom face of the contact is in the device isolation insulating film.

Figure 10:
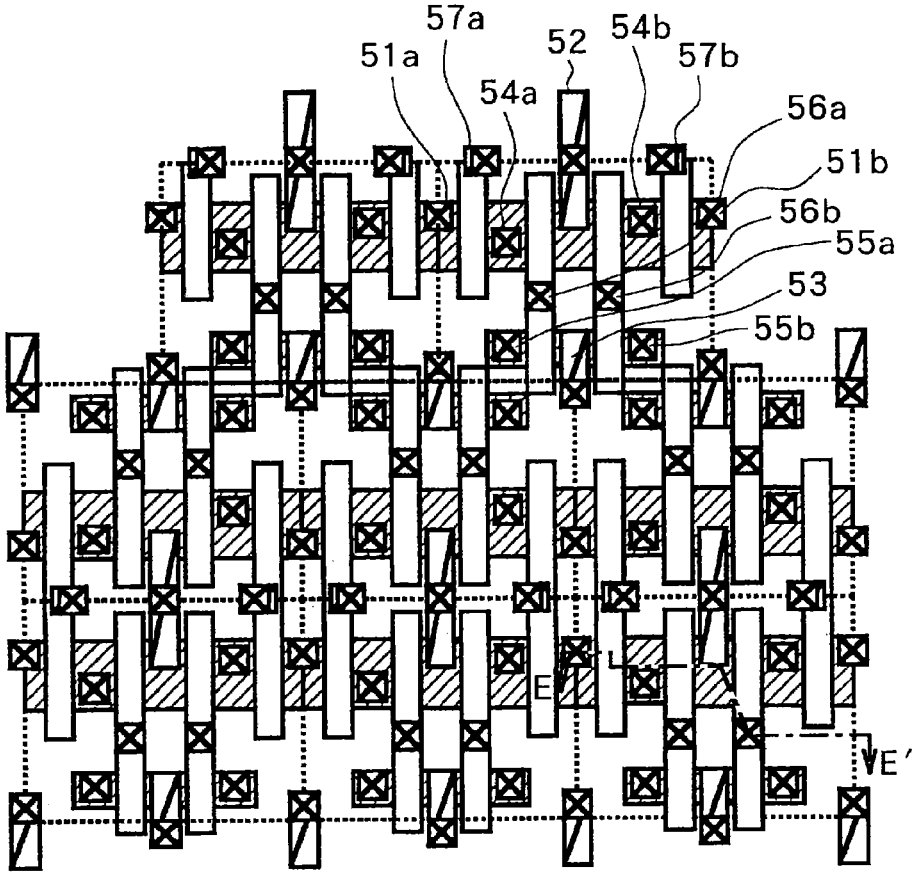
FIG. 10 is a pattern arrangement diagram for explaining the process of manufacturing the SRAM, which is continued from FIG. 8.
Figure 11:
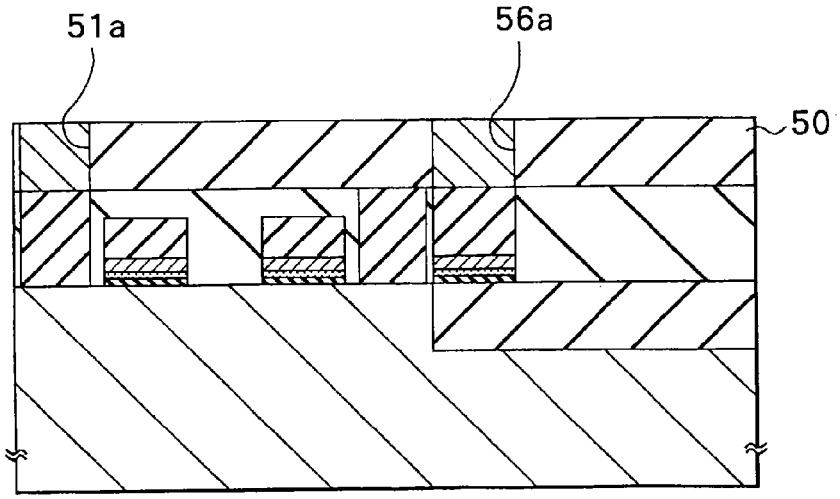
FIG. 11 is a cross section taken along the line E-E' of FIG. 10.

As illustrated in FIGS. 10 and 11, a second interlayer insulating film 50 is formed on the first interlayer insulating film 27. Subsequently, bit line contacts 51a and 51b are formed in positions corresponding to the bit line contacts 41a and 41b, in the interlayer insulating film 50. A ground line contact 52 is formed on the ground line contact 42. A power source line contact 53 is formed on the power source line contact 43. Storage node contacts 54a and 54b are formed on the n-type storage node contacts 44a and 44b. Storage node contacts 55a and 55b are formed on the p-type storage node contacts 45a and 45b. Gate electrode contacts 56a and 56b are formed on the gate electrode contacts 46a and 46b. Gate electrode contacts 57a and 57b are formed on the word line contacts 47a and 47b. The contacts 41a, 41b, . . . , 57a and 57b are formed by a conventional contact forming process. FIG. 11 is a cross section taken along the line E-E' of FIG. 10.

Figure 12:
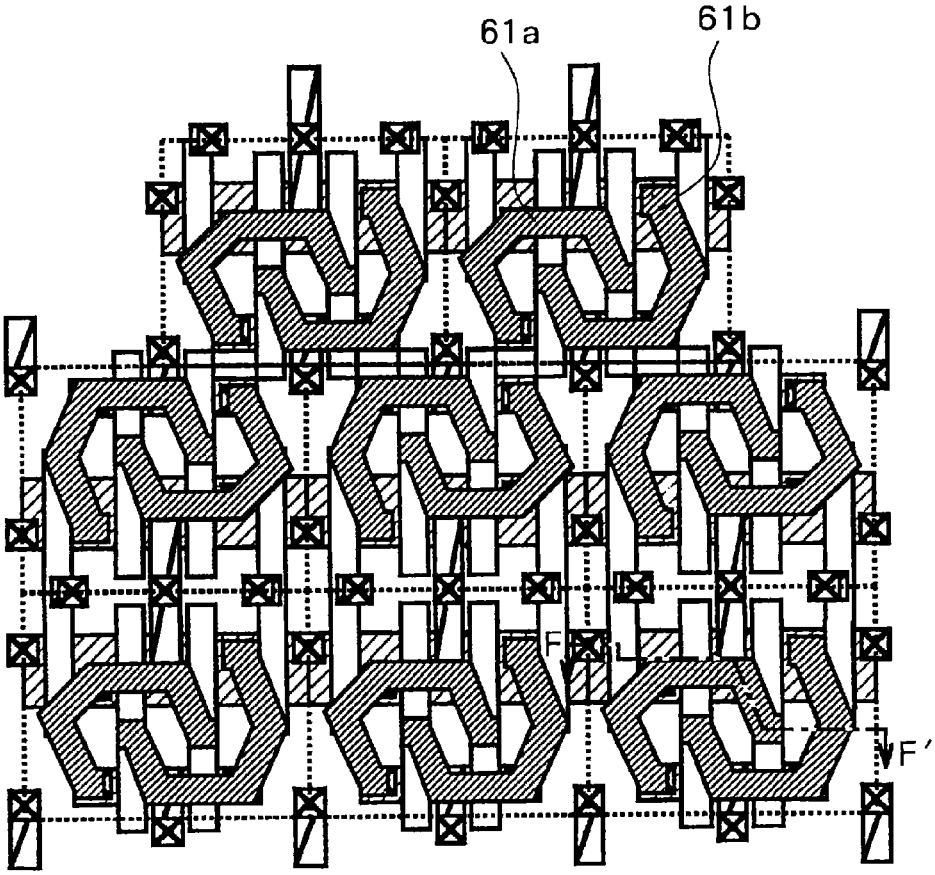
FIG. 12 is a pattern arrangement diagram for explaining the process of manufacturing the SRAM, which is continued from FIG. 10.
Figure 13:
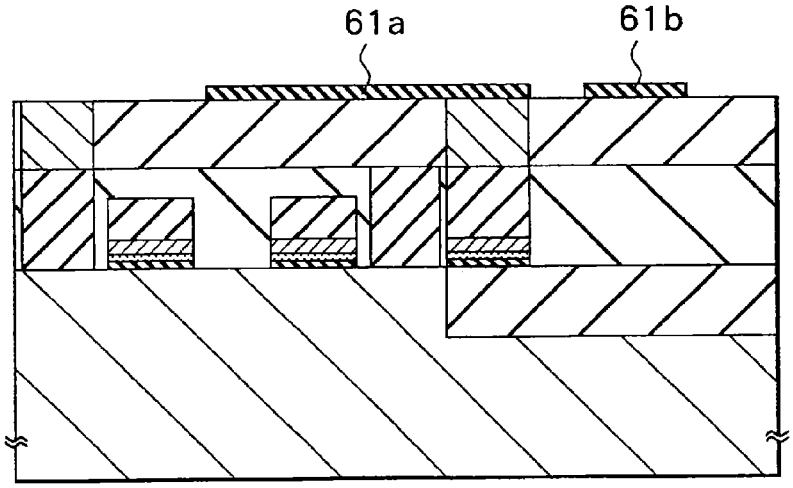
FIG. 13 is a cross section taken along the line F-F' of FIG. 12.

As shown in FIGS. 12 and 13, on the interlayer insulating film 50, a wire 61a for connecting the n-type storage node contact 54a, the p-type storage node contact 55a, and the gate electrode contact 56b, and a wire 61b for connecting the n-type storage node contact 54b, the p-type storage node contact 55b, and the gate electrode contact 56a are formed. The wires 61a and 61b are formed by a conventional semiconductor wiring process by using titanium (Ti) or a similar metal so as to have a thickness of about 50 to 200 nm. FIG. 13 is a cross section taken along the line F-F' of FIG. 12.

In the embodiment, the offset insulating film 26 is provided, the first interlayer insulating film 27 has a double layer structure of a high selective ratio, and the storage node contacts, the power source line contacts, and the common potential line contacts are subjected to etching of two stages so as to be opened collectively, thereby achieving the self alignment of the contacts.

Figure 14:
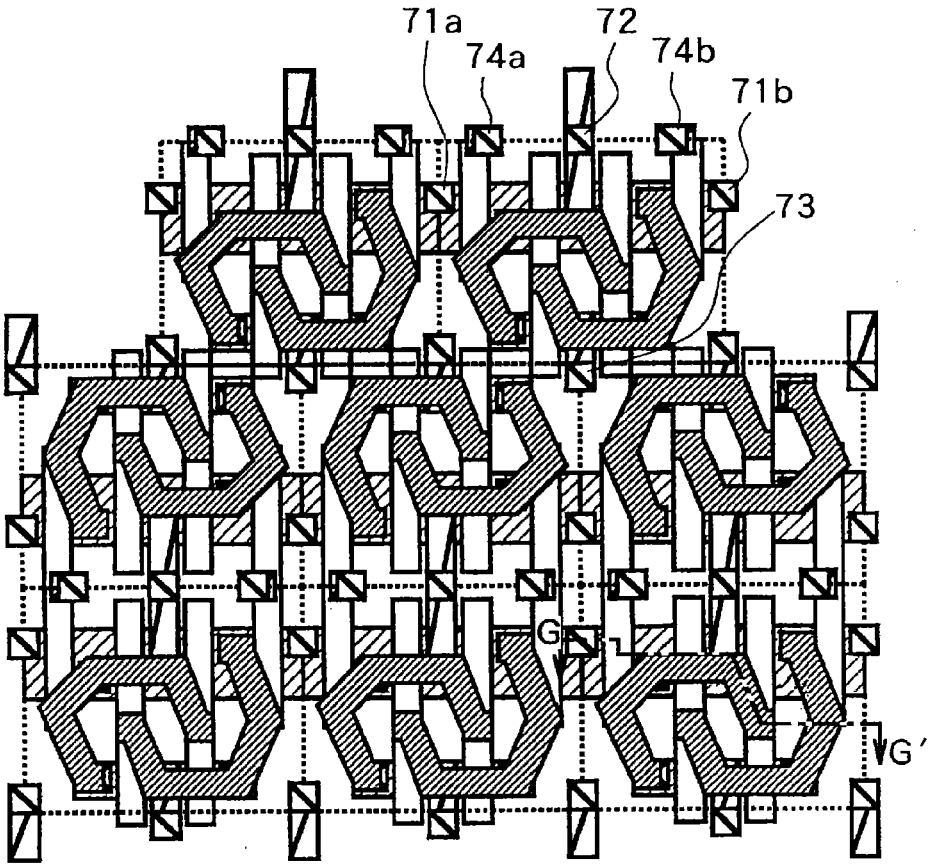
FIG. 14 is a pattern arrangement diagram for explaining the process of manufacturing the SRAM, which is continued from FIG. 12.
Figure 15:
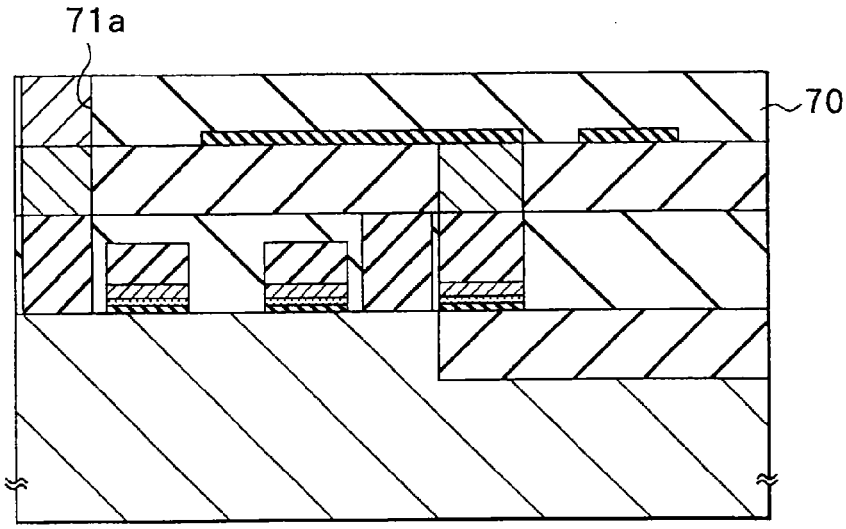
FIG. 15 is a cross section taken along the line G-G' of FIG. 14.

As shown in FIGS. 14 and 15, a third interlayer insulating film 70 is formed on the interlayer insulating film 50 and the wires 61a and 61b. Subsequently, bit line contact holes 71a and 71b are formed on the bit line contacts 51a and 51b. Further, a ground line contact 72 and a power source line contact 73 are formed on the ground line contact 52 and the power source line contact 53, respectively. Word line contacts 74a and 74b are formed on the gate electrode contacts 57a and 57b, respectively. FIG. 15 is a cross section taken along the line G-G' of FIG. 14.

Figure 16:
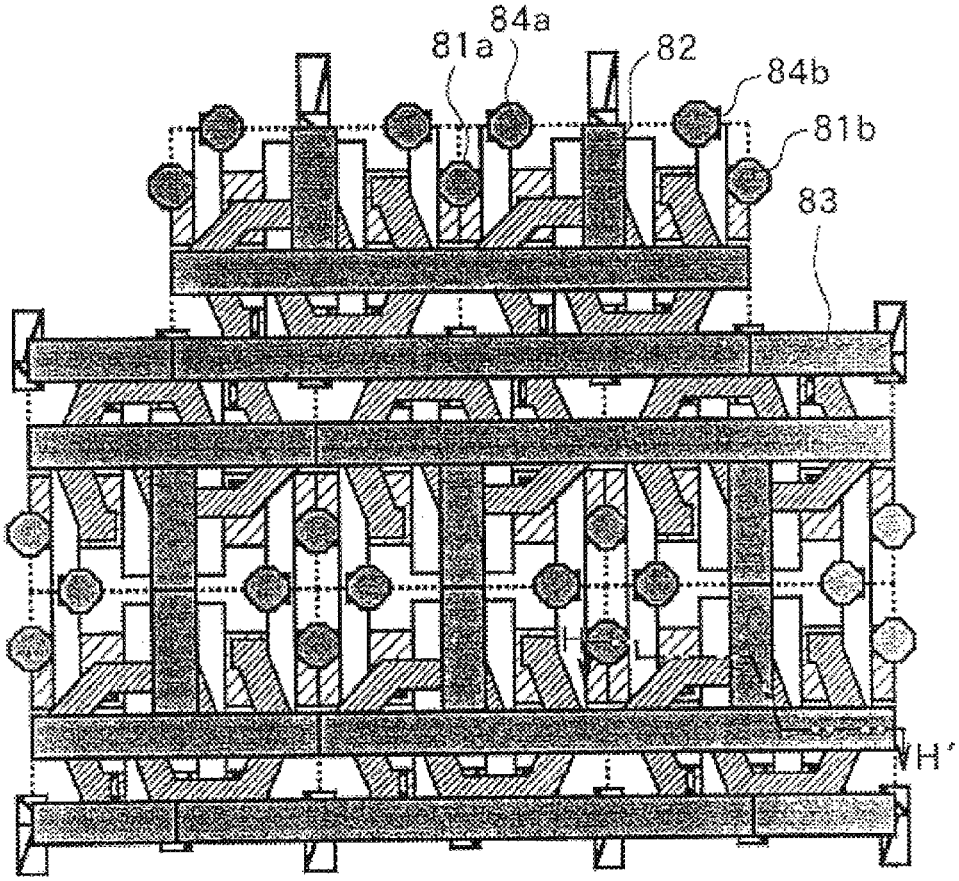
FIG. 16 is a pattern arrangement diagram for explaining the process of manufacturing the SRAM, which is continued from FIG. 14.
Figure 17:
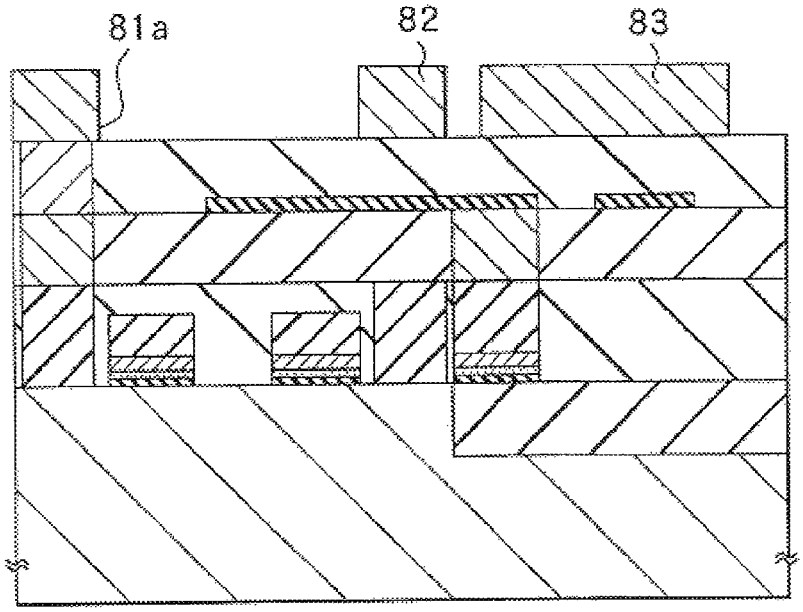
FIG. 17 is a cross section taken along the line H-H' of FIG. 16.

As illustrated in FIGS. 16 and 17, bit line connecting wires 81a and 81b which are connected to the bit line contacts 71a and 71b are formed. Further, a ground line 82 and a power source line 83 which are connected to the ground line contact 72 and the power source contact 73, respectively, are formed. Word line connecting wires 84a and 84b which are connected to the word line contacts 74a and 74b are formed. FIG. 17 is a cross section taken along the line H-H' of FIG. 16.

Figure 18:
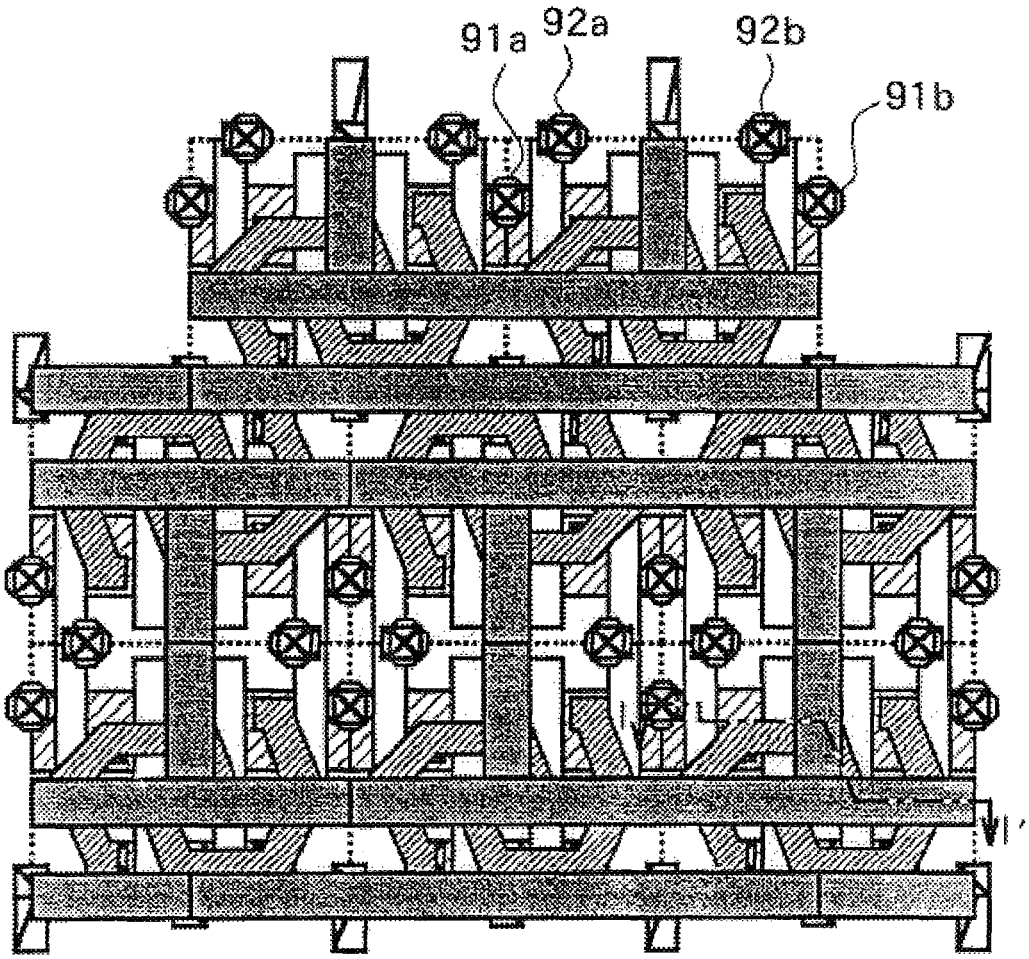
FIG. 18 is a pattern arrangement diagram for explaining the process of manufacturing the SRAM, which is continued from FIG. 16.
Figure 19:
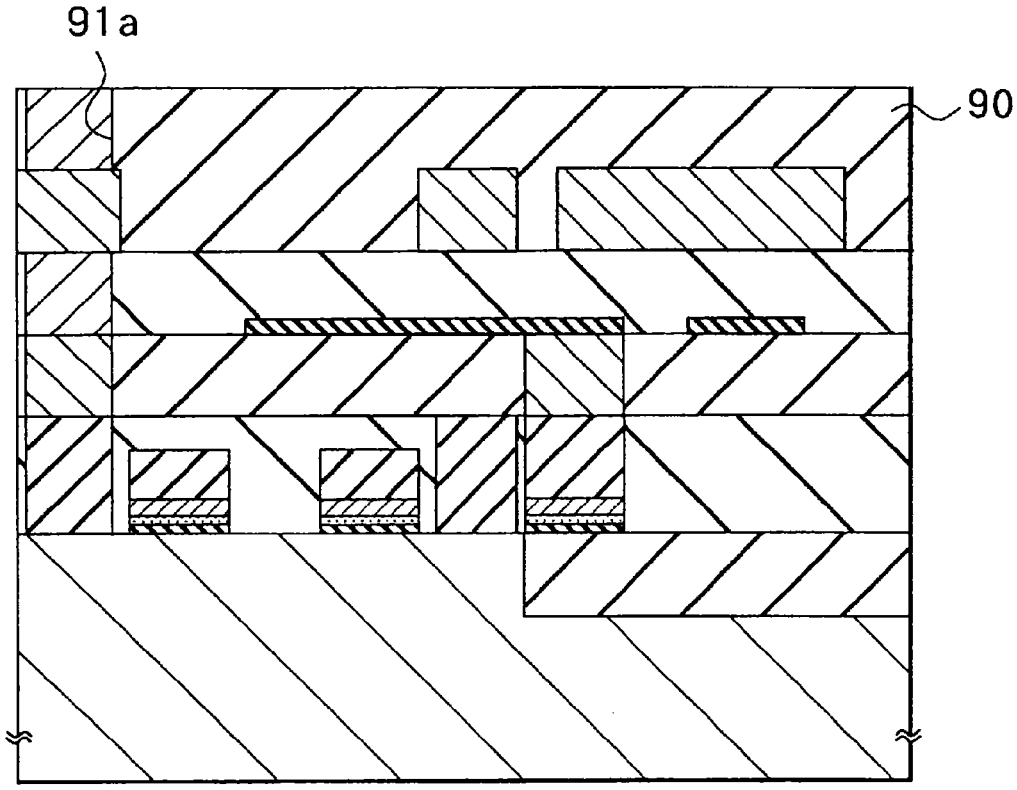
FIG. 19 is a cross section taken along the line I-I' of FIG. 18.

As shown in FIGS. 18 and 19, an interlayer insulating film 90 is formed on the interlayer insulating film 70 and the wires 81a, 81b, . . . , 84a, and 84b. Subsequently, bit line contacts 91a and 91b are formed on the bit line connecting wires 81a and 81b. Further, word line contacts 92a and 92b are formed on the word line connecting wires 84a and 84b. FIG. 19 is a cross section taken along the line I-I' of FIG. 18.

Figure 20:
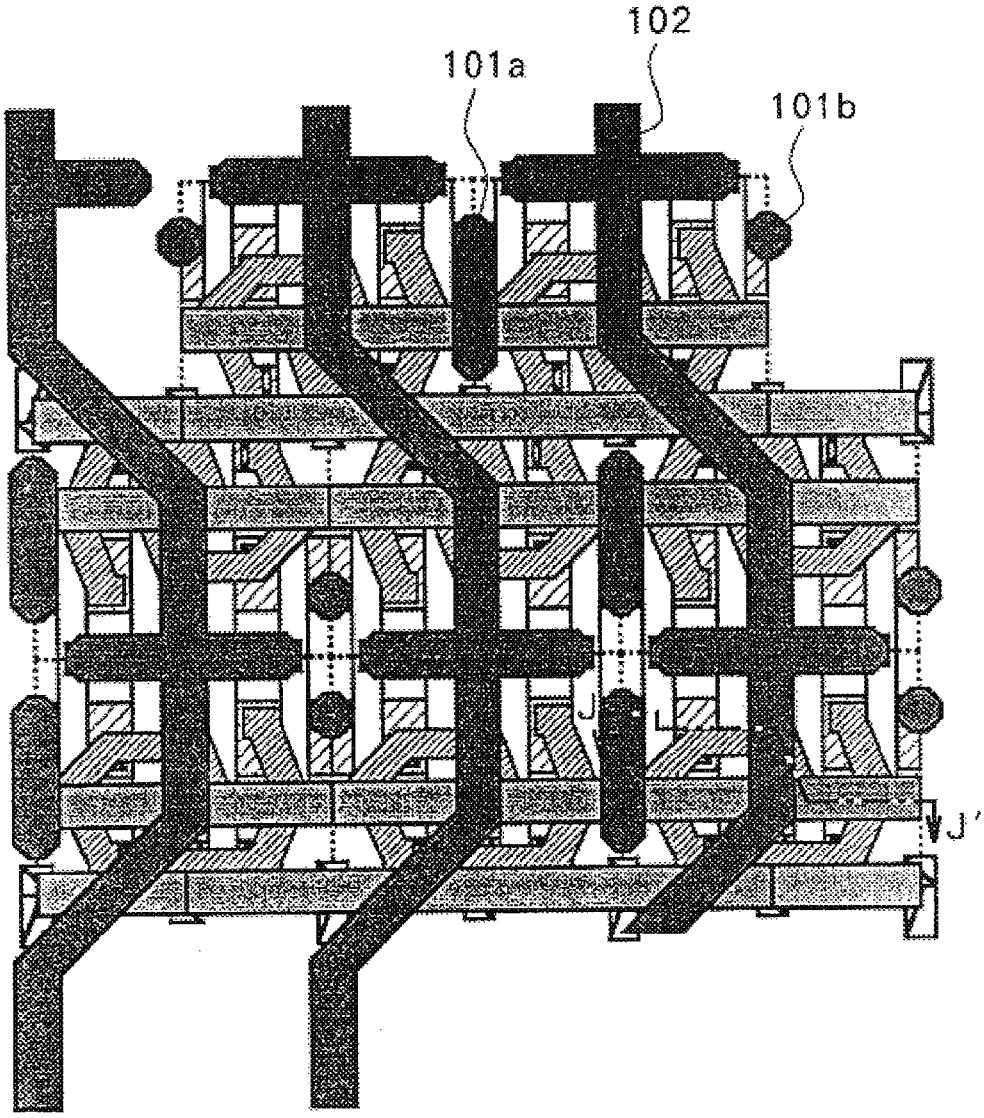
FIG. 20 is a pattern arrangement diagram for explaining the process of manufacturing the SRAM, which is continued from FIG. 18.
Figure 21:
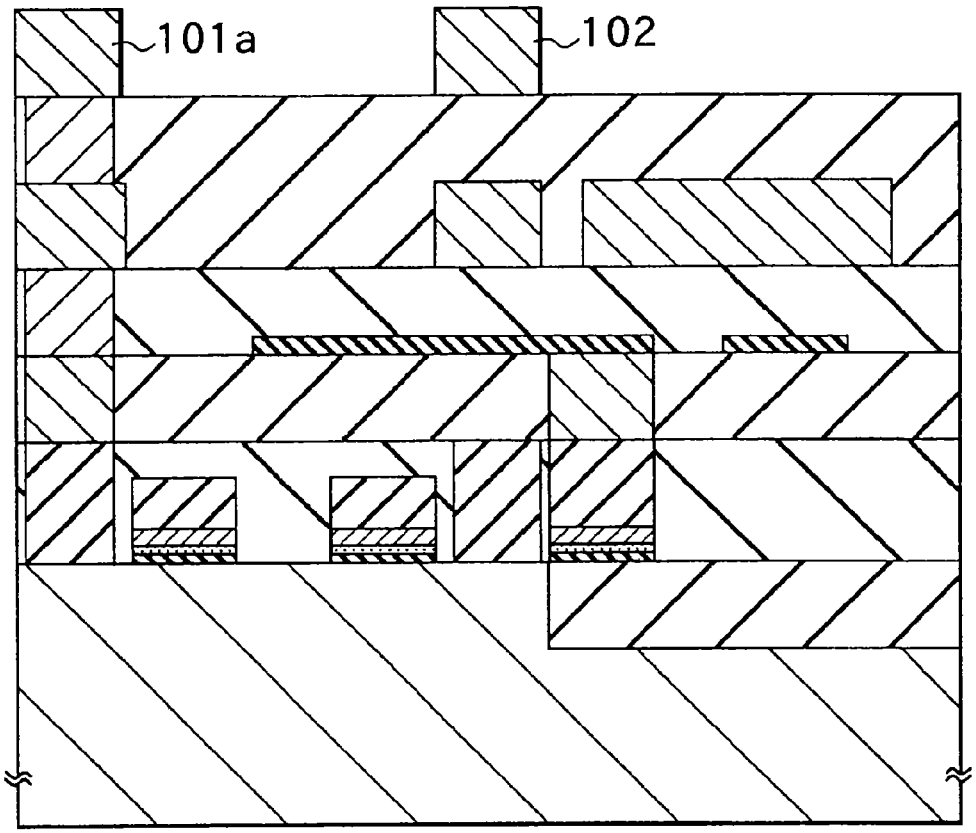
FIG. 21 is a cross section taken along the line J-J' of FIG. 20.

As shown in FIGS. 20 and 21, bit line connecting wires 101a and 101b which are connected to the bit line contacts 91a and 91b are formed. Further, a word line wire 102 to be connected to the word line contacts 92a and 92b is formed. FIG. 21 is a cross section taken along the line J-J' of FIG. 20.

Figure 22:
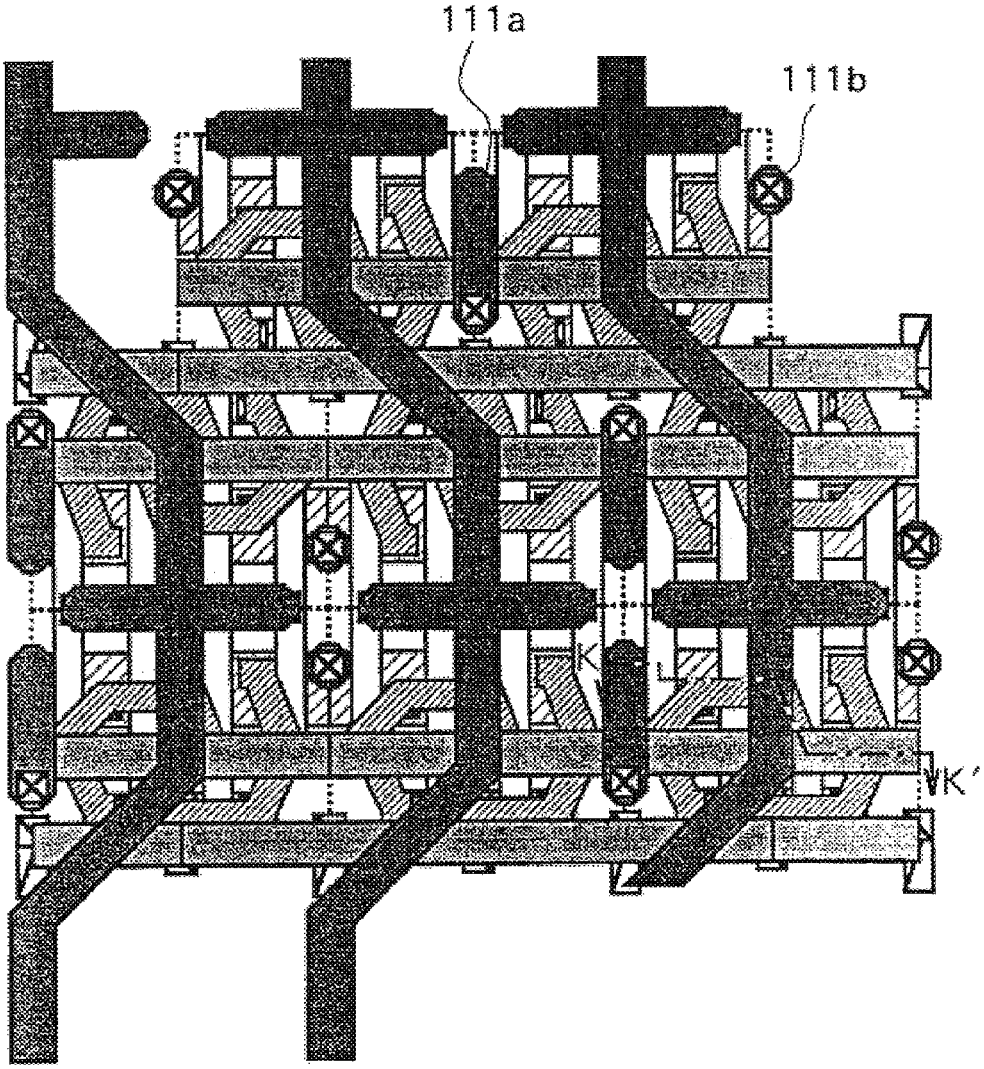
FIG. 22 is a pattern arrangement diagram for explaining the process of manufacturing the SRAM, which is continued from FIG. 20.
Figure 23:
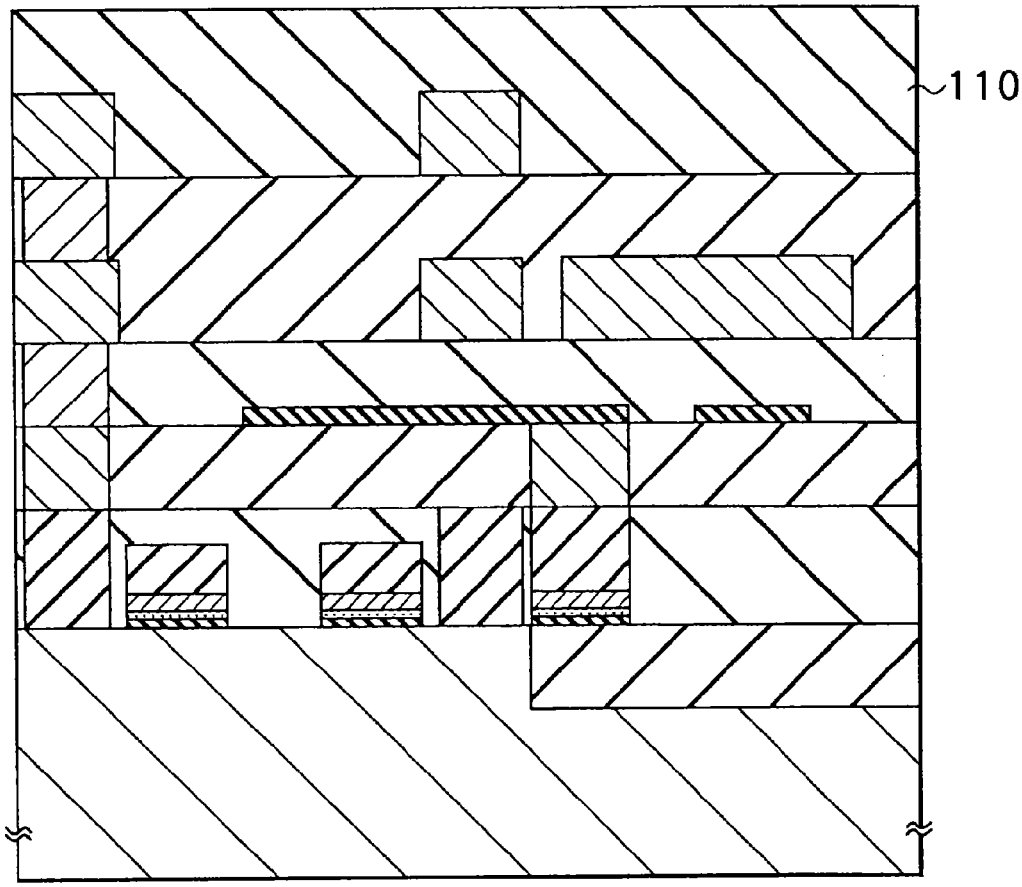
FIG. 23 is a cross section taken along the line K-K' of FIG. 22.

As illustrated in FIGS. 22 and 23, an interlayer insulating film 110 is formed on the interlayer insulating film 90 and the wires 101a, 101b, and 102. Bit line contacts 111a and 111b are formed on the bit line connecting wires 101a and 101b. FIG. 23 is a cross section taken along the line K-K' of FIG. 22.

Figure 24:
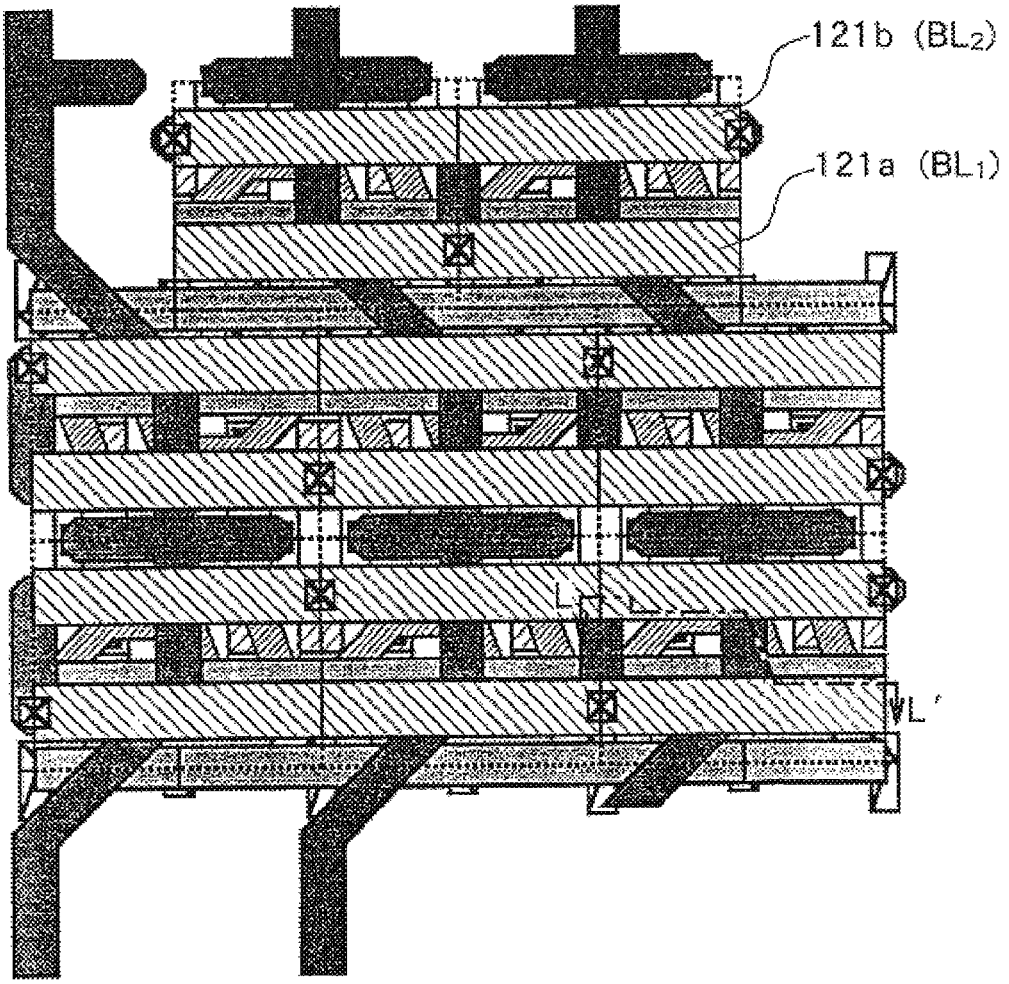
FIG. 24 is a pattern arrangement diagram for explaining the process of manufacturing the SRAM, which is continued from FIG. 22.
Figure 25:
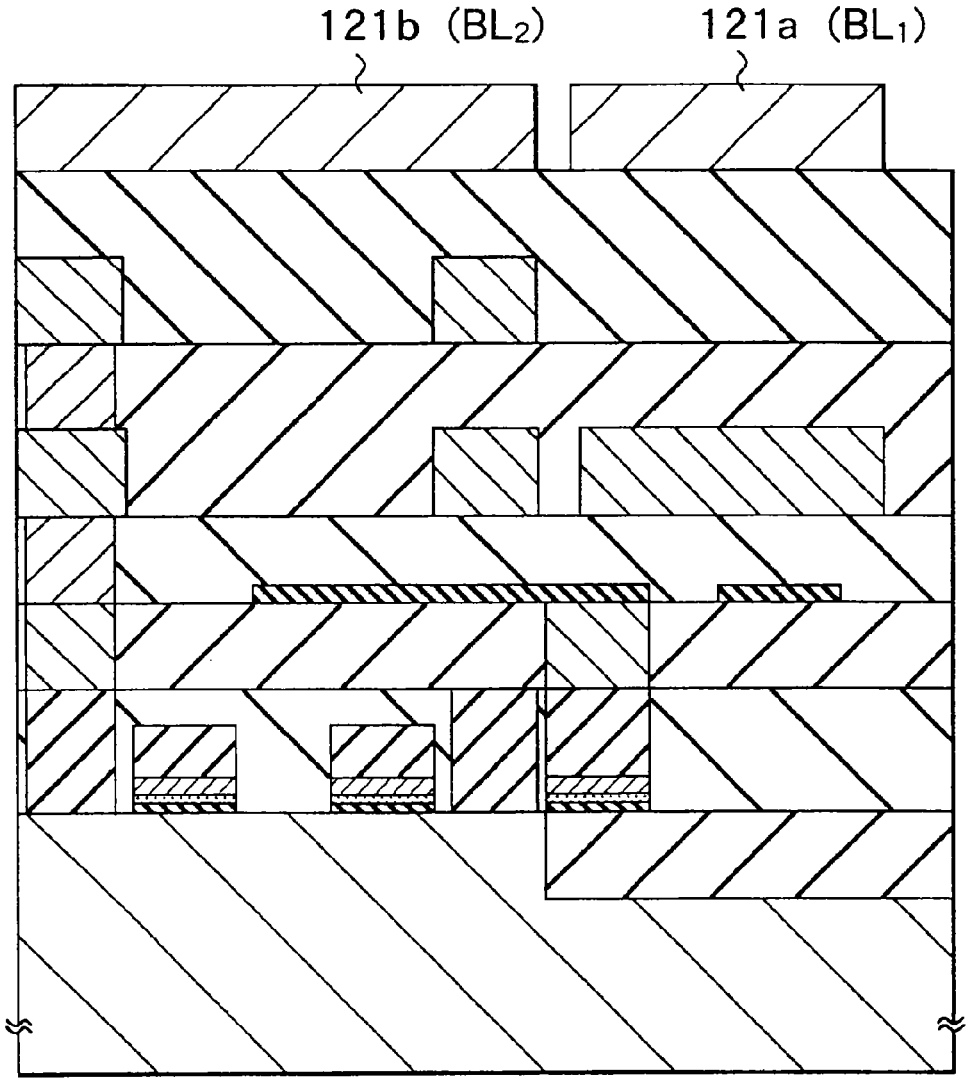
FIG. 25 is a cross section taken along the line L-L' of FIG. 24.

As shown in FIGS. 24 and 25, bit lines 121a and 121b ($BL_1$, $BL_2$) which are connected to the bit line contacts 111a and 111b are formed. FIG. 25 is a cross section taken along the line L-L' of FIG. 24. The contacts and the wires can be formed according to a conventional semiconductor contact and wire forming process. Finally, although not shown, after an upper wiring layer is further formed if necessary, a process of forming an overcoat film, opening a pad window, and the like is performed, and the connection process of the SRAM is finished.

In the embodiment, two memory cells which are neighboring in the word line direction are constructed so as to have a positional relation that the memory cells are deviated from each other in the direction which perpendicularly crosses the word line direction, and parts of the memory cells are arranged so as to be overlapped with each other in the word line direction. Consequently, the cell size can be reduced and the packing density can be increased.

Figure 26B:
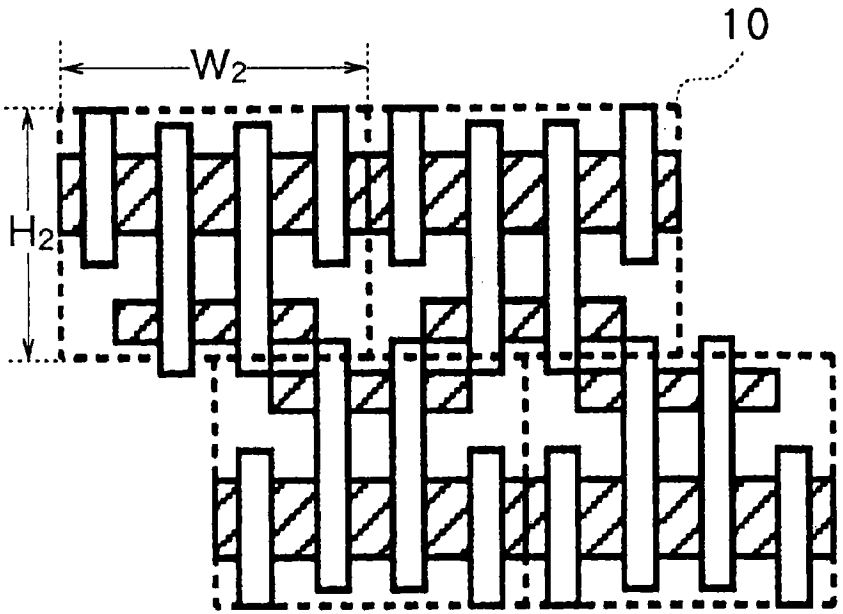
FIGS. 26A and 26B are a pattern arrangement diagram for explanation by comparing the size of an SRAM cell of a related art with that of an SRAM cell of the present invention.
Figure 26A:
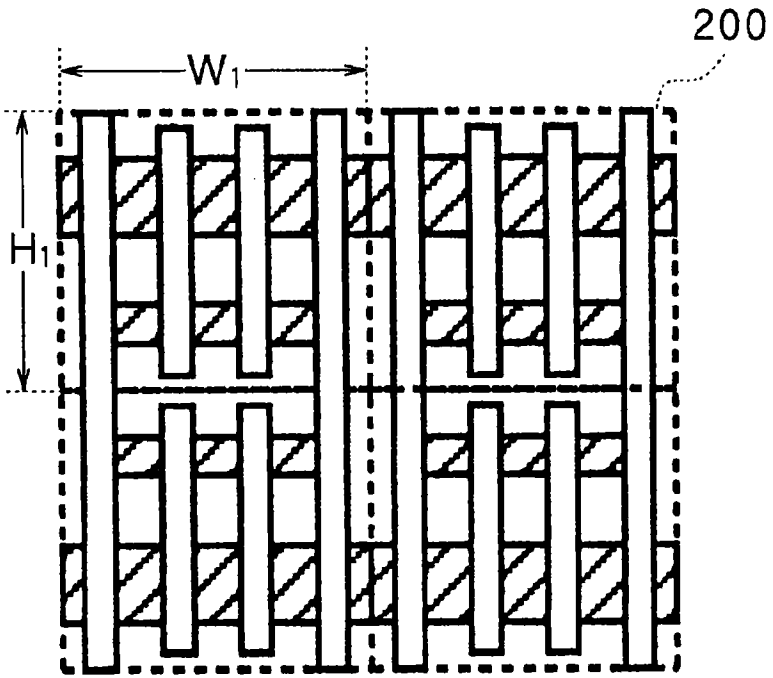
Figure 27:
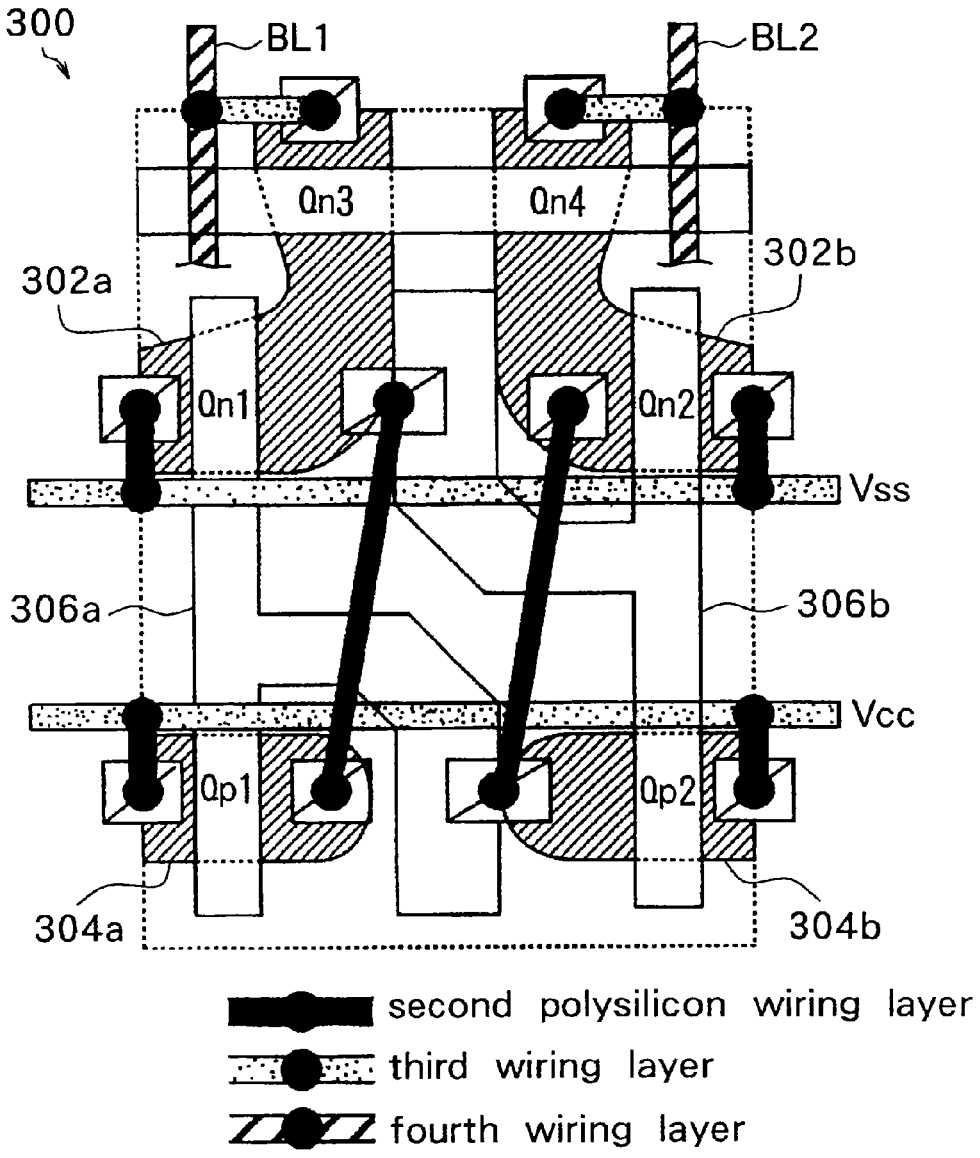
FIG.27 RELATED ART
FIG. 27 is a pattern arrangement diagram for explaining an example of the structure of an SRAM cell of a related art.
Figure 28:
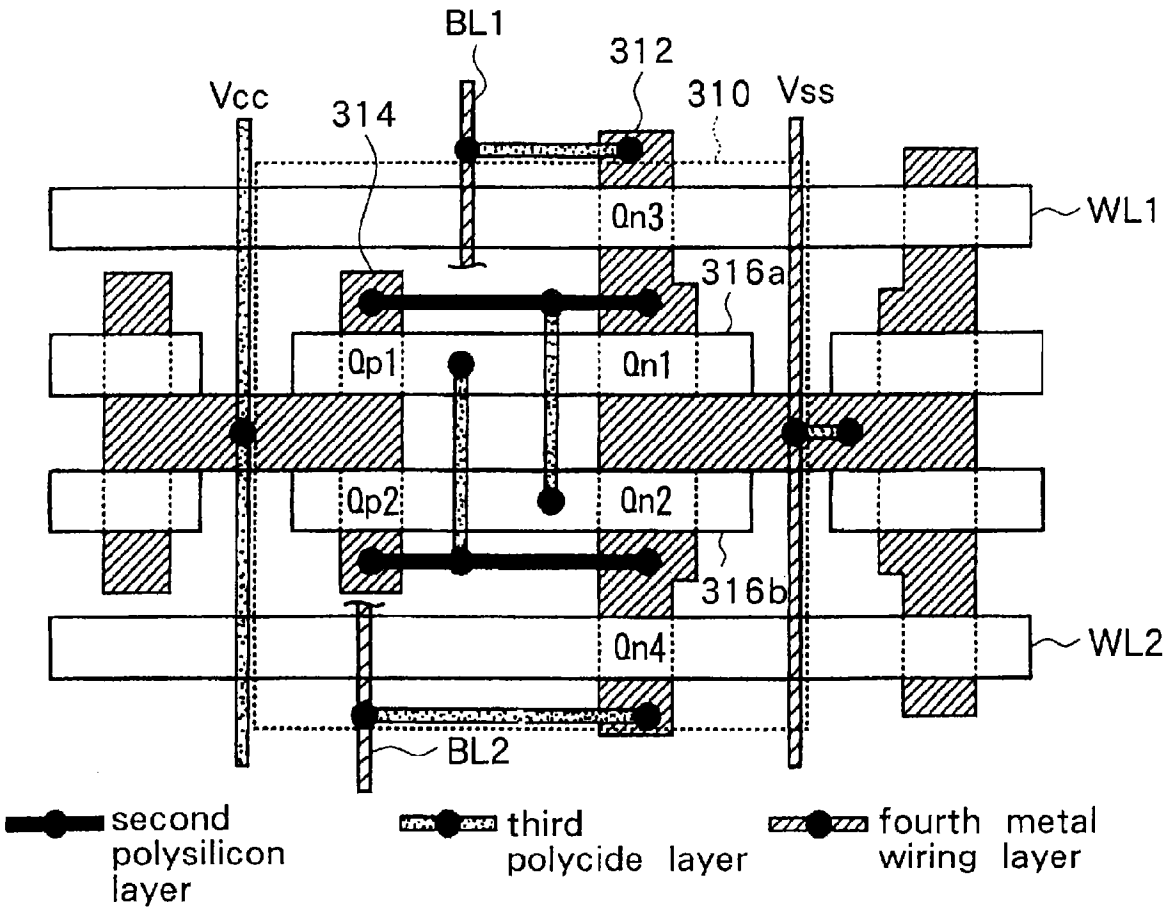
FIG.28 RELATED ART
FIG. 28 is a pattern arrangement diagram for explaining an example of the structure of an SRAM cell of another related art.
Figure 29:
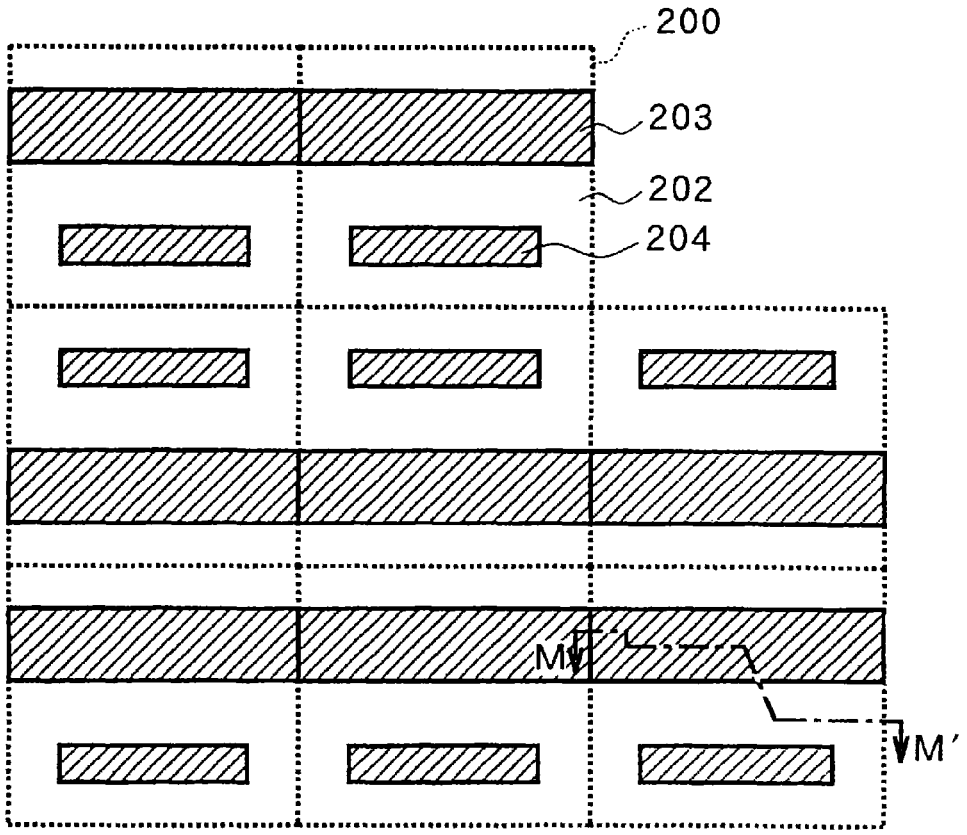
FIG.29 RELATED ART
FIG. 29 is a pattern arrangement diagram for explaining an outline of a process of manufacturing an SRAM, which has been proposed before in relation to the present invention.
Figure 30:
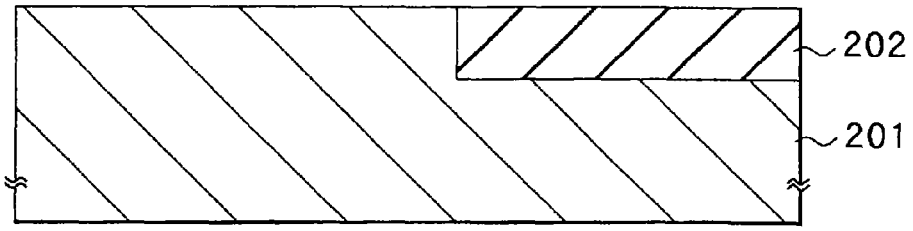
FIG.30 RELATED ART
FIG. 30 is a cross section taken along the line M-M' of FIG. 29.
Figure 31:
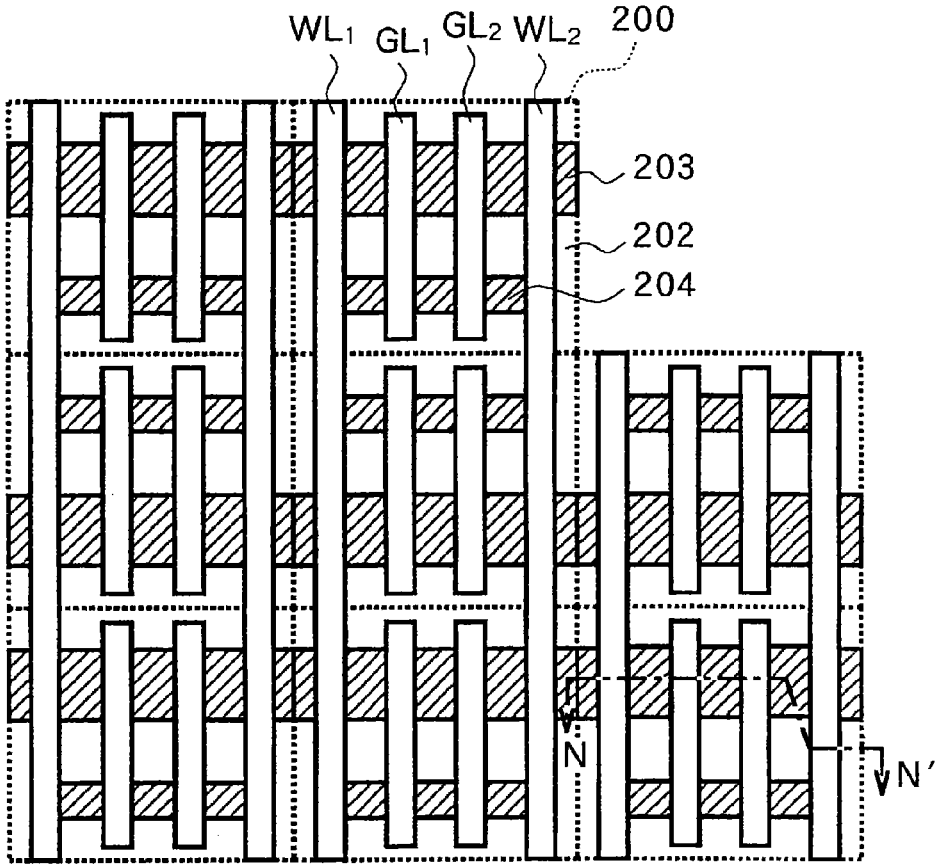
FIG.31 RELATED ART
FIG. 31 is a pattern arrangement diagram for explaining the process of manufacturing the SRAM, which is continued from FIG. 29.
Figure 32:
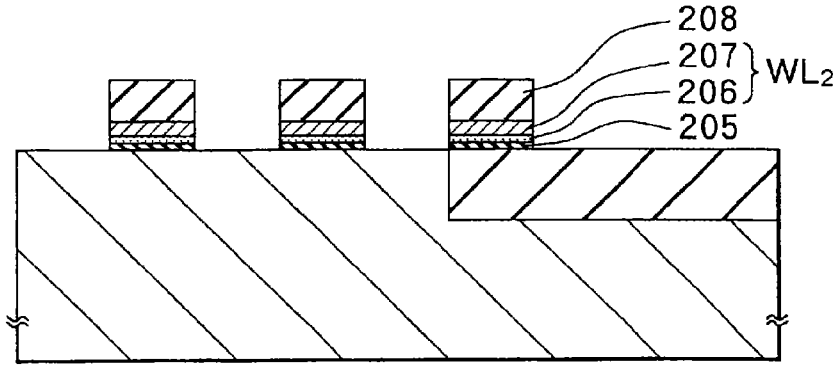
FIG.32 RELATED ART
FIG. 32 is a cross section taken along the line N-N' of FIG. 30.

FIGS. 26A and 26B are diagrams to show comparison between the size of an SRAM cell of a conventional art and that of an SRAM cell of the present invention. FIG. 26A illustrates the SRAM cells of the related art and FIG. 26B shows the SRAM cells of the invention. The size of one bit of the related art is 2.0 μm ($W_1$)×1.8 μm ($H_1$) while the size of one bit of the invention is 2.0 μm ($W_2$)×1.6 μm ($H_2$). For example, when the size is converted in the area of an array of 512×16 bits, the area of the conventional SRAM array is 29,491 $\mu m^2$ while that of the SRAM array of the invention is 26,266 $\mu m^2$. Thus, 11% of the area can be reduced.

Although the invention has been described by the foregoing embodiment, the invention is not limited to the embodiment but can be variously modified. For example, although the deviation amount of the neighboring memory cells is the half bit in the foregoing embodiment, the amount is arbitrary. For example, it can be a ¼ bit. The overlapping amount of the neighboring cells is also arbitrary.

In the semiconductor memory device of the invention as described above, two memory cells which are neighboring in the direction which perpendicularly crosses the channel current direction are arranged so as to have the positional relation such that the memory cells are deviated from each other in the channel current direction. Consequently, the neighboring two memory cells can be arranged with their parts overlapped with each other in the direction which perpendicularly crosses the channel current direction. Thus, effects such that the cell size can be reduced and the packing density can be increased are produced.

In another semiconductor memory device of the invention, two memory cells which are neighboring in the direction which perpendicularly crosses the channel current direction are arranged so as to have the positional relation such that the memory cells are deviated from each other in the channel current direction with their parts overlapped with each other. Consequently, the two memory cells can be arranged with their parts overlapped with each other. Thus, effects such that the memory cell size can be reduced and the packing density can be increased are produced.

Obviously many modifications and variations of the present invention are possible in the light of the above teachings. It is therefore to be understood that within the scope of the appended claims the invention may be practiced otherwise than as specifically described.

What is claimed is:

1. A semiconductor memory device having a plurality of SRAM cells each comprising a first transistor of a first conductive type and a second transistor of a second conductive type, wherein a first active region in which a channel of the first transistor is formed and a second active region in which a channel of the second transistor is formed are arranged so that the channel current direction of the first transistor and the channel current direction of the second transistor are in parallel to each other in each memory cell, and two memory cells, among the plurality of memory cells, which are adjacent to each other in one direction which perpendicularly crosses the channel current direction have a positional relation such that the two memory cells are deviated from each other in the channel current direction.

2. The semiconductor memory device according to claim 1, wherein two memory cells, among the plurality of memory cells, which are adjacent to each other in the other direction which perpendicularly crosses the channel current direction have a positional relation such that the two memory cells are aligned in the channel current direction.

3. A semiconductor memory device having a plurality of SRAM cells each comprising a first transistor of a first conductive type and a second transistor of a second conductive type, wherein a first active region in which a channel of the first transistor is formed and a second active region in which a channel of the second transistor is formed are arranged so that the channel current direction of the first transistor and the channel current direction of the second transistor are in parallel to each other in each memory cell, and two memory cells, among the plurality of memory cells, which are adjacent to each other in one direction which perpendicularly crosses the channel current direction have a positional relation such that the two memory cells are deviated from each other in the channel current direction and a part of a memory cell region of one of the two memory cells is overlapped with a part of a memory cell region of the other memory cell.

4. The semiconductor memory device according to claim 3, wherein two memory cells, among the plurality of memory cells, which are adjacent to each other in the other direction which perpendicularly crosses the channel current direction have a positional relation such that the two memory cells are aligned in the channel current direction.

5. The semiconductor memory device according to claim 3, wherein the first and second active regions are isolated from each other between the adjacent two memory cells.

6. The semiconductor memory device according to claim 3, wherein a pattern of a wiring layer which also serves as gate electrodes of the first and second transistors is disposed so as to perpendicularly cross the first or the second active region on the first or second active region.

7. The semiconductor memory device according to claim 3, wherein four of the first transistors are provided in series in the first active region, and two of the second transistors are provided in series in the second active region.

8. The semiconductor memory device according to claim 7, wherein each memory cell comprises:

stripe-shaped two word lines arranged in parallel, each of which is arranged so as to perpendicularly cross the first active region and also serves as a gate electrode of a word transistor of the first conductive type; and two common gate lines which are arranged in parallel to each other, each of which perpendicularly crosses both of the first and second active regions and connects gates of a set of a driving transistor of the first conductive type and a load transistor of the second conductive type.

*9. A semiconductor memory device having a plurality of SRAM cells each comprising:*

*a word transistor of a first conductive type, a drive transistor of the first conductivity type and a load transistor of a second conductive type,*

*wherein a first active region in which a channel of the word transistor and a channel of the drive transistor are formed and a second active region in which a channel of the load transistor is formed are arranged so that the channel current direction of the word transistor, the channel current direction of the drive transistor and the channel current direction of the load transistor are in parallel to each other in each of the SRAM cells, and*

*wherein two SRAM cells, among the plurality of SRAM cells, which are adjacent to each other in one direction which perpendicularly crosses the channel current direction have a positional relation such that the two SRAM cells are deviated from each other in the channel current direction.*

*10. The semiconductor memory device according to claim 9, wherein one of the two SRAM cells is between a first adjacent SRAM cell and a second adjacent SRAM cell.*

*11. The semiconductor memory device according to claim 10, wherein the first and second adjacent SRAM cells and said one of the two SRAM cells are disposed along a direction that is perpendicular to the channel current direction.*

*12. The semiconductor memory device according to claim 10, wherein the first active region and the second active region are in said one of the two SRAM cells, the first active region and the second active region being isolated from active regions in the first adjacent SRAM cell and active regions in the second adjacent SRAM cell.*

*13. The semiconductor memory device according to claim 10, wherein a local word line is a gate electrode of the word transistor in said one of the two SRAM cells and a gate electrode of another word transistor in the second adjacent SRAM cell.*

*14. The semiconductor memory device according to claim 9, wherein a common gate line is a gate electrode of the drive transistor and a gate electrode of the load transistor, the*

*common gate line perpendicularly crossing the first active region and the second active region.*

*15. The semiconductor memory device according to claim 9, wherein gate electrodes of the word transistors in the two SRAM cells are electrically connected to a common word line.*

*16. The semiconductor memory device according to claim 9, wherein the first conductivity type is n-type and the second conductivity type is p-type.*

* * * * *